US011838001B2

(12) United States Patent
Weng

(10) Patent No.: US 11,838,001 B2
(45) Date of Patent: Dec. 5, 2023

(54) BULK ACOUSTIC WAVE RESONATOR AND METHOD OF MANUFACTURING THE SAME

(71) Applicant: Shenzhen Newsonic Technologies Co., Ltd., Shenzhen (CN)

(72) Inventor: Guojun Weng, Shenzhen (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/074,109

(22) Filed: Dec. 2, 2022

(65) Prior Publication Data

US 2023/0097870 A1     Mar. 30, 2023

(30) Foreign Application Priority Data

Jul. 8, 2022   (CN) .......................... 202210796845.0

(51) Int. Cl.
*H03H 3/02*     (2006.01)
*H03H 9/13*     (2006.01)
(Continued)

(52) U.S. Cl.
CPC ......... *H03H 3/02* (2013.01); *H01L 21/02057* (2013.01); *H01L 21/02304* (2013.01);
(Continued)

(58) Field of Classification Search
CPC ............... H03H 3/02; H03H 2003/021; H03H 2003/022; H03H 2003/023; H03H 2003/028; H03H 9/02118; H03H 9/02047; H03H 9/0509; H03H 9/0523; H03H 9/105; H03H 9/13; H03H 9/171; H03H 9/173;
(Continued)

(56) References Cited

U.S. PATENT DOCUMENTS

| 2012/0073099 A1* | 3/2012 | Iwamoto | H03H 3/02 29/25.35 |
| 2012/0205754 A1* | 8/2012 | Iwamoto | H03H 9/02102 257/E21.001 |
| 2017/0244386 A1* | 8/2017 | Bower | H03H 9/0585 |
| 2017/0310299 A1* | 10/2017 | Bower | H03H 9/545 |

(Continued)

FOREIGN PATENT DOCUMENTS

| CN | 113572446 A | 10/2021 |
| CN | 114553163 A | 5/2022 |

*Primary Examiner* — Peter Dungba Vo
*Assistant Examiner* — Joshua D Anderson
(74) *Attorney, Agent, or Firm* — Leason Ellis LLP

(57) ABSTRACT

A bulk acoustic wave resonator and a method of manufacturing the same are provided. The bulk acoustic wave resonator includes: a first carrier substrate; a barrier layer on a main surface of the first carrier substrate and configured to prevent an undesired conductive channel from being generated due to charge accumulation on the main surface; a buffer layer on a side of the barrier layer away from the first carrier substrate; a piezoelectric layer on a side of the buffer layer away from the barrier layer; a first electrode and a second electrode on opposite sides of the piezoelectric layer; a first passivation layer and a second passivation layer, respectively covering sidewalls of the first electrode and the second electrode; a dielectric layer between the first passivation layer and the buffer layer, wherein a first cavity is provided between the first passivation layer and the dielectric layer.

17 Claims, 37 Drawing Sheets

(51) Int. Cl.
*H03H 9/17* (2006.01)
*H01L 21/20* (2006.01)
*H01L 21/02* (2006.01)

(52) U.S. Cl.
CPC ........... *H01L 21/2007* (2013.01); *H03H 9/13* (2013.01); *H03H 9/173* (2013.01); *H01L 21/02496* (2013.01); *H01L 2224/11001* (2013.01); *H03H 2003/021* (2013.01); *Y10T 29/42* (2015.01); *Y10T 29/49005* (2015.01)

(58) Field of Classification Search
CPC ........... H01L 21/02057; H01L 21/0206; H01L 21/02304; H01L 21/02488; H01L 21/02469; H01L 21/02499; H01L 21/02502; H01L 21/02505; H01L 21/02694; H01L 21/2007; H01L 21/707; H01L 21/76251; H01L 21/76254; H01L 21/76259; H01L 21/764; H01L 2224/11001; H01L 2224/11002; Y10T 29/42; Y10T 29/49005
See application file for complete search history.

(56) References Cited

U.S. PATENT DOCUMENTS

| | | | |
|---|---|---|---|
| 2018/0054176 A1* | 2/2018 | Kim | H10N 30/88 |
| 2019/0288658 A1* | 9/2019 | Kim | H03H 9/02118 |
| 2020/0013948 A1* | 1/2020 | Moe | C23C 14/34 |
| 2020/0111949 A1* | 4/2020 | Moe | H10N 30/853 |
| 2020/0152858 A1* | 5/2020 | Moe | H10N 30/076 |
| 2020/0259070 A1* | 8/2020 | Moe | H10N 30/079 |
| 2020/0304087 A1* | 9/2020 | Kim | H10N 30/877 |
| 2020/0313639 A1* | 10/2020 | Kim | H10N 30/875 29/25.35 |
| 2021/0067123 A1* | 3/2021 | Shealy | H10N 39/00 |
| 2021/0091742 A1* | 3/2021 | Gorisse | H03H 9/02031 |
| 2021/0234525 A1* | 7/2021 | Kim | H03H 9/105 |
| 2022/0352456 A1* | 11/2022 | Moe | C23C 14/025 |

\* cited by examiner

BULK ACOUSTIC WAVE RESONATOR AND METHOD OF MANUFACTURING THE SAME

CROSS-REFERENCE TO RELATED APPLICATIONS

The application claims priority to the Chinese patent application No. 202210796845.0, filed on Jul. 8, 2022, the entire disclosure of which is incorporated herein by reference as part of the present application.

TECHNICAL FIELD

Embodiments of the present disclosure relate to a bulk acoustic wave resonator and a method of manufacturing the same.

BACKGROUND

With the rapid development of mobile communication technology, filters based on resonators are more and more widely used in communication devices such as smartphones. In a film bulk acoustic wave resonator (FBAR), a lower electrode, a piezoelectric layer and an upper electrode are usually formed in sequence on a base substrate, thereby forming a resonant structure with piezoelectric property on the base substrate. In terms of some conventional FBAR structures, a piezoelectric layer having piezoelectric property is generally formed on a substrate by a process, such as physical vapor deposition (PVD) or chemical vapor deposition (CVD), but lithium niobate crystal or lithium tantalate crystal having piezoelectric property cannot be deposited on the substrate of bulk acoustic wave resonator by the process such as PVD or CVD. Therefore, traditional deposition methods cannot be used to form a piezoelectric layer constituted by lithium niobate crystal or lithium tantalate crystal having piezoelectric property for a bulk acoustic wave resonator. In addition, in a conventional resonator, an undesired conductive channel due to charge accumulation may be generated on the surface of base substrate, and during the etching process for forming a resonant cavity, electrodes on the piezoelectric layer may be exposed to the etching process and thus be damaged, which further affect the performance of the resonator. In order to improve the performance of the bulk acoustic wave resonator, the structure of the bulk acoustic resonator is continuously optimized.

SUMMARY

At least one embodiment of the disclosure provides a method for manufacturing a bulk acoustic wave resonator, comprising: proving a first substrate structure comprising a first portion configured for forming a piezoelectric layer of the bulk acoustic wave resonator and a second portion serving as a sacrificial substrate, wherein the first portion is located on the second portion; forming a first electrode and a first passivation layer on a side of the first portion of the first substrate structure away from the second portion, wherein the first passivation layer covers sidewalls of the first electrode and a surface of the first electrode at a side away from the first substrate structure; forming a sacrificial layer and a dielectric layer on the first passivation layer, wherein the sacrificial layer covers a portion of the first passivation layer and is partially overlapped with the first electrode in a direction perpendicular to a main surface of the first substrate structure, and the dielectric layer covers the first passivation layer and the sacrificial layer; providing a second substrate structure comprising a second substrate, and a barrier layer and a buffer layer sequentially formed on a main surface of the second substrate, wherein the barrier layer is configured to prevent an undesired conductive channel from being generated due to charge accumulation on the main surface of the second substrate; performing a bonding process to bond the buffer layer of the second substrate structure to the dielectric layer on the first substrate structure; removing the second portion of the first substrate structure, and remaining the first portion to form the piezoelectric layer; forming a second electrode and a second passivation layer on a side of the piezoelectric layer away from the first electrode, wherein the second passivation layer covers sidewalls of the second electrode and a surface of the second electrode at a side away from the piezoelectric layer; performing an etching process to remove the sacrificial layer and form a first cavity between the first passivation layer and the dielectric layer, wherein the first passivation layer and the second passivation layer are configured to protect the first electrode and the second electrode during the etching process; and forming a first conductive connector and a second conductive connector to be respectively connected to the first electrode and the second electrode.

In the method of manufacturing the bulk acoustic wave resonator according to an embodiment of the disclosure, the first substrate structure is a piezoelectric substrate, and removing the second portion of the first substrate structure comprises: before forming the first electrode and the first passivation layer, performing an ion implantation process on the piezoelectric substrate to define a cleavage plane in the piezoelectric substrate, such that the piezoelectric substrate comprises the first portion and the second portion on opposite sides of the cleavage plane; and after bonding the second substrate structure, performing an annealing process on the piezoelectric substrate, such that the piezoelectric substrate is split along the cleavage plane, and the second portion of the piezoelectric substrate is removed.

The method of manufacturing the bulk acoustic wave resonator according to an embodiment of the disclosure, further comprises: after removing the second portion of the piezoelectric substrate, performing a planarization process on the first portion.

In the method of manufacturing the bulk acoustic wave resonator according to an embodiment of the disclosure, the first portion of the first substrate structure is a piezoelectric material layer, and the second portion of the first substrate structure comprises a first substrate and an insulating layer, the insulating layer is formed between the first substrate and the piezoelectric material layer, wherein removing the second portion of the first substrate structure comprises: removing the first substrate by at least one of a grinding process and an etching process, so as to expose a side of the insulating layer away from the piezoelectric material layer; and removing the insulating layer by at least one of a grinding process and an etching process.

In the method of manufacturing the bulk acoustic wave resonator according to an embodiment of the disclosure, the second substrate is a semiconductor substrate, and at least a surface layer of the barrier layer in contact with the semiconductor substrate is a non-conductive and non-silicon-oxide layer.

In the method of manufacturing the bulk acoustic wave resonator according to an embodiment of the disclosure, a material of the second substrate comprises monocrystalline silicon, and a material of the barrier layer comprises at least one selected from the group consisting of polysilicon, amorphous silicon, silicon nitride, silicon carbide, aluminum nitride, and gallium nitride.

In the method of manufacturing the bulk acoustic wave resonator according to an embodiment of the disclosure, the buffer layer is configured to control a warpage degree of the second substrate structure.

In the method of manufacturing the bulk acoustic wave resonator according to an embodiment of the disclosure, a material of the buffer layer comprises at least one selected from the group consisting of silicon nitride, silicon oxide, aluminum nitride, polysilicon, and amorphous silicon.

In the method of manufacturing the bulk acoustic wave resonator according to an embodiment of the disclosure, the etching process has an etching selectivity ratio of the sacrificial layer to the first passivation layer and the second passivation layer, such that the first passivation layer and the second passivation layer are not removed by the etching process.

In the method of manufacturing the bulk acoustic wave resonator according to an embodiment of the disclosure, during the etching process, the first passivation layer and the second passivation layer respectively separate the first electrode and the second electrode apart from an etching substance used in the etching process, such that the first electrode and the second electrode are not corroded by the etching substance.

In the method of manufacturing the bulk acoustic wave resonator according to an embodiment of the disclosure, performing the etching process to remove the sacrificial layer comprises: forming a release hole extending through the second passivation layer, the piezoelectric layer and the first passivation layer, wherein the release hole exposes a portion of a surface of the sacrificial layer at a side close to the first passivation layer; and applying the etching substance to a region where the sacrificial layer is located through the release hole, so as to remove the sacrificial layer, and form the first cavity at the location previously occupied by the sacrificial layer.

In the method of manufacturing the bulk acoustic wave resonator according to an embodiment of the disclosure, the first conductive connector and the second conductive connector are formed on a side of the second passivation layer away from the piezoelectric layer, and the first conductive connector extends through the second passivation layer, the piezoelectric layer and the first passivation layer to be electrically connected to the first electrode, and the second conductive connector extends through the second passivation layer to be electrically connected to the second electrode.

The method of manufacturing the bulk acoustic wave resonator according to an embodiment of the disclosure, further comprises: forming a first bonding seal ring portion on the side of the second passivation layer away from the piezoelectric layer, wherein the first bonding seal ring portion is formed on an edge of the second passivation layer, and the first conductive connector and the second conductive connector are located in a region laterally surrounded by the first bonding seal ring portion in a direction parallel to the main surface of the second substrate, and are spaced apart from the first bonding seal ring portion.

In the method of manufacturing the bulk acoustic wave resonator according to an embodiment of the disclosure, the first bonding seal ring portion, the first conductive connector and the second conductive connector are formed in a same manufacturing process.

The method of manufacturing the bulk acoustic wave resonator according to an embodiment of the disclosure, further comprises: providing a third substrate structure comprising a third substrate and a bonding layer formed on the third substrate, wherein the bonding layer comprises a first bonding connection part, a second bonding connection part and a second bonding seal ring portion that are spaced apart from each other, and the first bonding connection part and the second bonding connection part are located in a region laterally surrounded by the second bonding seal ring portion in the direction parallel to the main surface of the second substrate.

The method of manufacturing the bulk acoustic wave resonator according to an embodiment of the disclosure, further comprises: bonding the first bonding connection part, the second bonding connection part, and the second bonding seal ring portion of the third substrate structure to the first conductive connector, the second conductive connector, and the first bonding seal ring portion, respectively, wherein the first bonding seal ring portion and the second bonding seal ring portion constitute a seal ring structure, and the seal ring structure, the third substrate and the second passivation layer enclose to form a second cavity.

The method of manufacturing the bulk acoustic wave resonator according to an embodiment of the disclosure, further comprises: forming a redistribution layer on a side of the third substrate away from the piezoelectric layer, wherein the redistribution layer comprises a first conductive line and a second conductive line, and the first conductive line and the second conductive line respectively extend through the third substrate to be electrically connected to the first bonding connection part and the second bonding connection part.

The method of manufacturing the bulk acoustic wave resonator according to an embodiment of the disclosure, further comprises: forming a first conductive bump and a second conductive bump to be electrically connected to the first conductive line and the second conductive line, respectively, wherein the first conductive bump is electrically connected to the first electrode through the first conductive line, the first bonding connection part and the first conductive connector; and the second conductive bump is electrically connected to the second electrode through the second conductive line, the second bonding connection part and the second conductive connector.

In the method of manufacturing the bulk acoustic wave resonator according to an embodiment of the disclosure, the second conductive connector comprises a body part and an extension part, the body part is overlapped with the second electrode in a direction perpendicular to the main surface of the second substrate, while the extension part is not overlapped with the second electrode in the direction perpendicular to the main surface of the second substrate, wherein surfaces of the body part and the extension part at a side away from the piezoelectric layer have a height difference in the direction perpendicular to the main surface of the second substrate, and the second bonding connection part laps on the extension part.

In the method of manufacturing the bulk acoustic wave resonator according to an embodiment of the disclosure, a thickness of the second bonding connection part in the direction perpendicular to the main surface of the second substrate is greater than the height difference.

An embodiment of the disclosure provides a bulk acoustic wave resonator, comprising: a first carrier substrate; a barrier layer, located on a main surface of the first carrier substrate and configured to prevent an undesired conductive channel from being generated due to charge accumulation on the main surface of the first carrier substrate; a buffer layer, located on a side of the barrier layer away from the first carrier substrate; a piezoelectric layer, located on a side of the buffer layer away from the barrier layer; a first electrode and a second electrode, located on opposite sides of the piezoelectric layer in a direction perpendicular to the main surface of the first carrier substrate, wherein the first electrode is disposed on a side of the piezoelectric layer close to the first carrier substrate; a first passivation layer and a second passivation layer, respectively covering sidewalls of the first electrode and the second electrode, and surfaces of the first electrode and the second electrode at sides away from the piezoelectric layer; a dielectric layer, located between the first passivation layer and the buffer layer, wherein a first cavity is provided between the first passivation layer and the dielectric layer, and the first cavity and the first electrode are spaced apart from each other by the first passivation layer.

The bulk acoustic wave resonator according to an embodiment of the disclosure, further comprises: a second carrier substrate, located on a side of the second electrode away from the piezoelectric layer; and a seal ring structure, located on a side of the second passivation layer close to the second carrier substrate and on an edge of the second passivation layer, wherein the seal ring structure, the second carrier substrate and the second passivation layer enclose to define a second cavity, and the second cavity, the second electrode, the piezoelectric layer, the first electrode and the first cavity are overlapped with each other in the direction perpendicular to the main surface of the first carrier substrate.

The bulk acoustic wave resonator according to an embodiment of the disclosure, further comprises: a first connection structure and a second connection structure, located on a side of the second passivation layer away from the piezoelectric layer, wherein the first connection structure extends through the second passivation layer, the piezoelectric layer and the first passivation layer and is electrically connected to the first electrode; and the second connection structure extends through the second passivation layer and is electrically connected to the second electrode, wherein the first connection structure and the second connection structure are located in the second cavity.

BRIEF DESCRIPTION OF THE DRAWINGS

In order to more clearly explain the technical solution of the embodiments of the present disclosure, the drawings of the embodiments will be briefly introduced below. It is obvious that the drawings in the following description only refer to some embodiments of the present disclosure, not the limitations of the present disclosure. It should be noted that, according to standard practice in this industry, features are not drawn to scale. In fact, for the sake of clarity, the dimensions of various features can be arbitrarily increased or decreased.

FIG. 1 to FIG. 24A and FIG. 24B are schematic cross-sectional views and top views illustrating various process steps in a method of manufacturing a bulk acoustic wave resonator according to some embodiments of the present disclosure.

DETAILED DESCRIPTION

Figure 1:
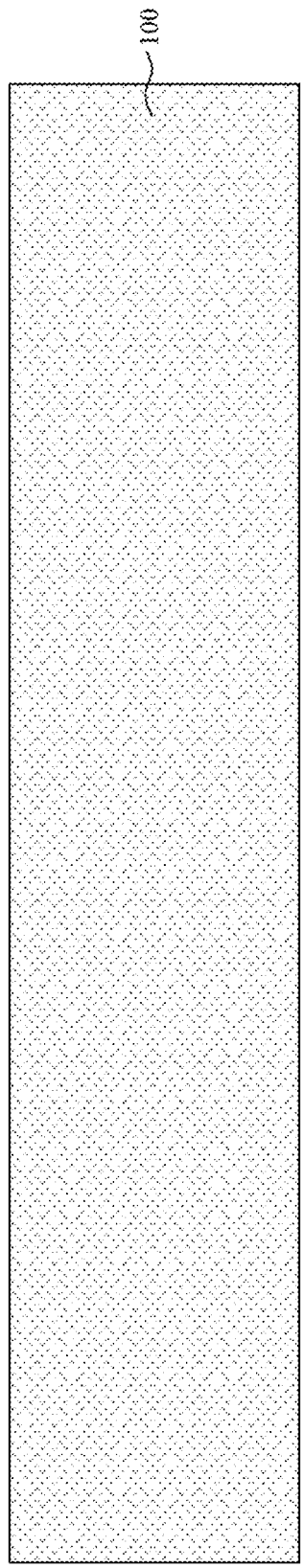

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly.

In the embodiment of the present disclosure, the orientation or position relationship indicated by the terms "on", "under", "inside", "middle", "outside", "front", "back", etc. is based on the orientation or position relationship shown in the drawings. These terms are mainly used to better describe the embodiments of the present disclosure, and are not used to define that the indicated device, element or component must have a specific orientation, or be constructed and operated in a specific orientation. In addition to the orientations illustrated in the drawings, the spatial relativity term is intended to cover different orientations of devices in use or operation. The equipment can be oriented in other ways (rotated by 90 degrees or in other orientations), and the terms of spatial relativity used herein can also be interpreted accordingly. In addition, some of the above terms may be used to express other meanings besides orientation or position relationship, for example, the term "on" may also be used to express some dependency or connection relationship in some cases. For those skilled in the art, the specific meanings of these terms in the embodiments of the present disclosure can be understood according to specific situations.

According to the manufacturing method of a bulk acoustic wave resonator according to various embodiments of the present disclosure, a piezoelectric layer of the bulk acoustic wave resonator is formed using a piezoelectric substrate, for example, the piezoelectric substrate is a monocrystalline piezoelectric wafer formed by a manufacturing process including a crystal pulling step, and the material of the piezoelectric substrate may include lithium niobate crystal, lithium tantalate crystal, or the like with good piezoelectric properties. In this way, forming a piezoelectric layer of the resonator by a traditional deposition process can be avoided, and in the embodiments of the present disclosure, the piezoelectric layer of the resonator formed from the piezoelectric wafer can use lithium niobate crystal, lithium tantalate crystal as the piezoelectric layer, which has good piezoelectric property, and can further improve the bandwidth of bulk acoustic wave resonator.

In some embodiments, a barrier layer is formed on a main surface of a carrier substrate (e.g., a first carrier substrate), and a cleaning process is performed on the carrier substrate prior to forming the barrier layer, so as to remove a native oxide layer that may be existed on the surface of the carrier substrate. The barrier layer is configured to avoid undesired conductive channel from being generated due to charge accumulation on the surface of the carrier substrate, thereby avoiding radio frequency (RF) loss of the resonator, and further improving the quality factor (Q) and performance of the resonator. In some embodiments, a buffer layer is formed on a side of the barrier layer away from the carrier substrate, which can create a better bonding interface condition to facilitate the bonding of the carrier substrate to the dielectric layer on the piezoelectric layer.

On the other hand, passivation layers are respectively formed on opposite sides of the piezoelectric layer to cover (e.g., completely cover) sidewalls of electrodes located on the opposite sides of the piezoelectric layer and cover the surfaces of the electrodes at the sides away from the piezoelectric layer, such that during the etching process for forming a cavity (e.g., a first cavity), the passivation layers can protect the electrodes from being damaged by the etching process.

In addition, in the embodiments of the present disclosure, through forming a first edge seal ring portion on the edge of the passivation layer over the piezoelectric layer, and forming a second edge seal ring portion at a corresponding location on another carrier substrate (e.g., a second carrier substrate), and then bonding the first edge seal ring portion and the second edge seal ring portion to each other to form a seal ring structure, the seal ring structure, the second carrier substrate, and the passivation layer enclose to form a cavity (e.g., a second cavity). Further, the first edge seal ring portion may be formed simultaneously with first and second conductive connecters in a same manufacturing process, the first and second conductive connectors are connected to the first and second electrodes, respectively. Such a method can simplify the process steps and save the manufacturing cost.

FIG. 1 to FIG. 24A and FIG. 24B are schematic cross-sectional views illustrating various stages in a method of manufacturing a bulk acoustic wave resonator according to some embodiments of the present disclosure.

Referring to FIG. 1, in some embodiments, a piezoelectric substrate 100 is provided. The piezoelectric substrate 100 includes a piezoelectric material having piezoelectric property, such as lithium niobate crystal, lithium tantalate crystal, or the like. The piezoelectric substrate 100 may be a monocrystalline piezoelectric substrate. In some embodiments, for example, the piezoelectric substrate 100 is a piezoelectric wafer, and may be formed by a manufacturing method including process steps of fabricating crystal bar and dicing process. For example, a crystal pulling process (e.g., a Czochralski process) is used to form a piezoelectric crystal bar, and a dicing process is then performed on the piezoelectric crystal bar to form a plurality of piezoelectric wafers. In some embodiments, a grinding process, a polishing process, a cleaning process may be formed on the crystal bar/wafer before and/or after the dicing process. In some embodiments, the thickness of the piezoelectric substrate 100 ranges from 200 μm to 400 μm, but the present disclosure is not limited thereto. The thickness of the piezoelectric substrate 100 can be adjusted according to product requirement.

Figure 2:
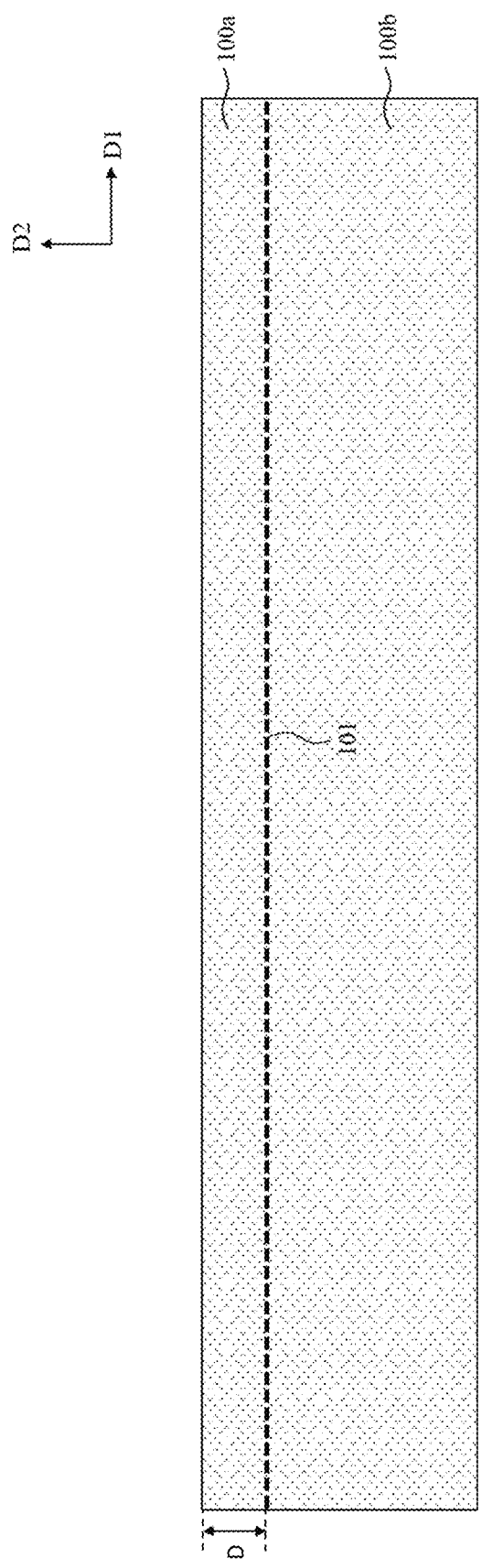

Referring to FIG. 2, in some embodiments, a cleavage plane 101 is defined in the piezoelectric substrate 100. The cleavage plane 101 is a plane along which the piezoelectric substrate 100 will be split in a subsequent process step. For example, the cleavage plane substantially extends in a direction parallel to the main surface of the piezoelectric substrate 100 (e.g., a horizontal direction including the direction D1). In some embodiments, an ion implantation process is performed on the piezoelectric substrate 100 to implant an implantation species (e.g., hydrogen ions, helium ions, the like, or combinations thereof) into the piezoelectric substrate 100, so as to form the cleavage plane 101. The implantation species may also be referred to as cleavage ions. In the ion implantation process, the cleavage ions pass through the upper portion of the piezoelectric substrate 100 and reach a desired depth of the piezoelectric substrate 100 to form the cleavage plane 101. The depth of the cleavage plane 101 can be adjusted by adjusting the energy of the ion implantation process. It should be understood that, although the cleavage plane 101 is shown in a dotted line in FIG. 2, the cleavage plane 101 may be a doped layer included in the piezoelectric substrate 100, and the doped layer has a relatively high concentration of cleavage ions and has a certain thickness. In some embodiments, the cleavage plane 101 may also be referred to as a cleavage layer or a to-be-split layer. The piezoelectric substrate 100 may also be referred to as a substrate structure, such as a first substrate structure.

After the cleavage plane 101 is formed, the piezoelectric substrate 100 includes a first portion 100 located above the cleavage plane 101 and a second portion 100b located below the cleavage plane 101. The first portion 100a is used for forming a piezoelectric layer serving as a part of the resonator, and the second portion 100b is a to-be-removed portion that is to be removed in a subsequent process. That is to say, the second portion 100b serves as a sacrificial substrate. In some embodiments, the location of the cleavage plane 101 in the piezoelectric substrate 100, i.e., the depth of ion implantation, depends on the thickness of the piezoelectric layer required for the resonator. For example, the thickness of the piezoelectric layer required for the resonator ranges from 0.2 μm to 2 μm. The depth D of the cleavage plane 101 (i.e., the depth of ion implantation or the thickness of the first portion 100a) may be approximately equal to or slightly greater than the required thickness of the piezoelectric layer, that is, the range of depth D may be approximately equal to or slightly greater than the aforementioned thickness range of the piezoelectric layer. For example, the depth D ranges from about 0.3 μm to 3 μm. The depth D of the cleavage plane 101 is defined by the vertical distance from the top surface of the piezoelectric substrate 100 to the top surface of the cleavage plane 101 in a direction (e.g., the direction D2) perpendicular to the top surface of the piezoelectric substrate 100, and may be approximately equal to the thickness of the first portion 100a of the piezoelectric substrate 100. In some embodiments, the depth D of the cleavage plane 101 (i.e., the thickness of the first portion 100a) is approximately equal to or greater than the thickness of the piezoelectric layer in the final resonator structure. In some embodiments, the concentration of the implantation species in the piezoelectric substrate 100 is approximately distributed normally in a direction (e.g., the direction D2) perpendicular to the top surface of the piezoelectric substrate 100, and has the highest concentration at the cleavage plane 101, but the present invention is not limited thereto, and the implantation species in the piezoelectric substrate 100 may also adopt other types of distribution forms. In some embodiments, small amounts of implantation species may further be included in the first portion 100a and the second portion 100b of the piezoelectric substrate 100 at the positions adjacent to the cleavage plane 101. However, the present disclosure is not limited thereto.

Figure 3:
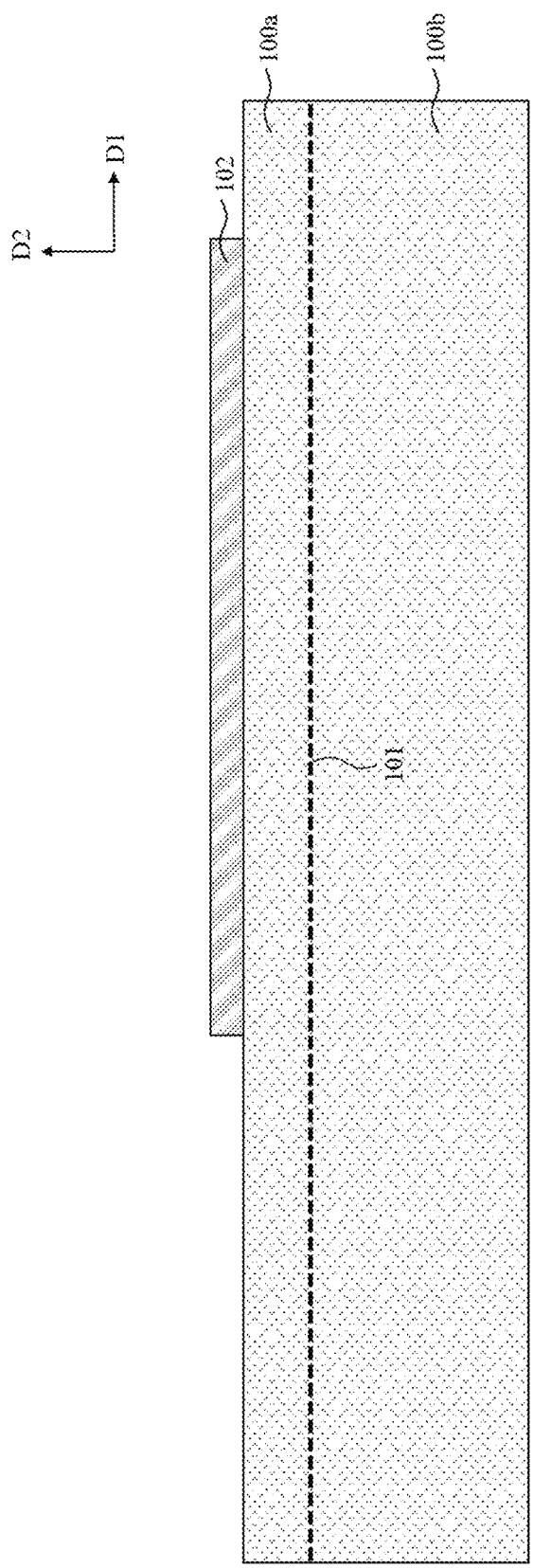

Referring to FIG. 3, an electrode 102 is formed on the first portion 100a of the piezoelectric substrate 100. The electrode 102 includes a metal material, such as molybdenum (Mo), aluminum (Al), copper (Cu), platinum (Pt), tantalum (Ta), tungsten (W), palladium (Pd), ruthenium (Ru), the like, alloys thereof, or combinations thereof. The electrode 102 is formed by, for example, forming an electrode material layer on the piezoelectric substrate 100 through a deposition process such as physical vapor deposition (PVD), and then performing a patterning process on the electrode material layer. In some embodiments, the process temperature for forming the electrode 102 is controlled within an appropriate temperature range, such that the process temperature is lower than the temperature required for the split of the cleavage plane 101, and the piezoelectrical substrate 100 would not be split along the cleavage plane 101 during the process step of forming the electrode 102. For example, the process temperature for forming the electrode 102 is controlled below 400 degrees Celsius, that is, less than 400 degrees Celsius.

Figure 4:
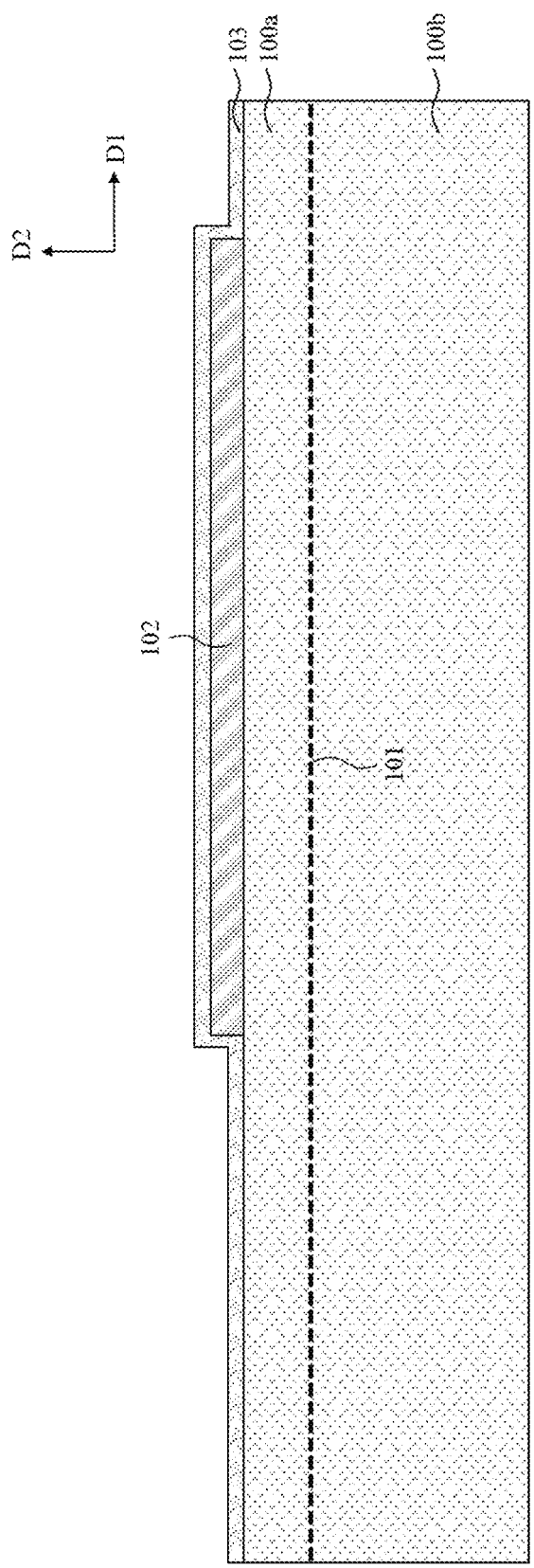

Referring to FIG. 4, a passivation layer 103 is formed over the piezoelectric substrate 100 to cover the electrode 102. For example, the passivation layer 103 completely covers the sidewalls of the electrode 102 and the surface of the electrode 102 at the side away from the piezoelectric substrate 100. In some embodiments, the passivation layer 103 is used to protect the electrode 102 from being corroded by the etching process in the subsequent etching process for forming the resonant cavity, and the passivation layer 103 is formed from a material that is substantially not corroded by the etching process. For example, the etching process uses $XeF_2$ as an etching substance, and the material of the passivation layer 103 is not corroded by $XeF_2$. In some embodiments, the passivation layer 103 includes a non-metal material, such as a dielectric material. For example, the passivation layer 103 may include aluminum nitride, silicon nitride, silicon oxide, the like, or combinations thereof, and may be a single-layer structure, or a multi-layer structure which a stacked layer including combinations of the aforementioned materials. The passivation layer 103 may be formed by a deposition process such as CVD, and the process temperature of the passivation layer 103 is also controlled within a temperature range lower than the temperature required for the split of cleavage plane, for example, the process temperature is controlled below 400 degrees Celsius.

Figure 5:
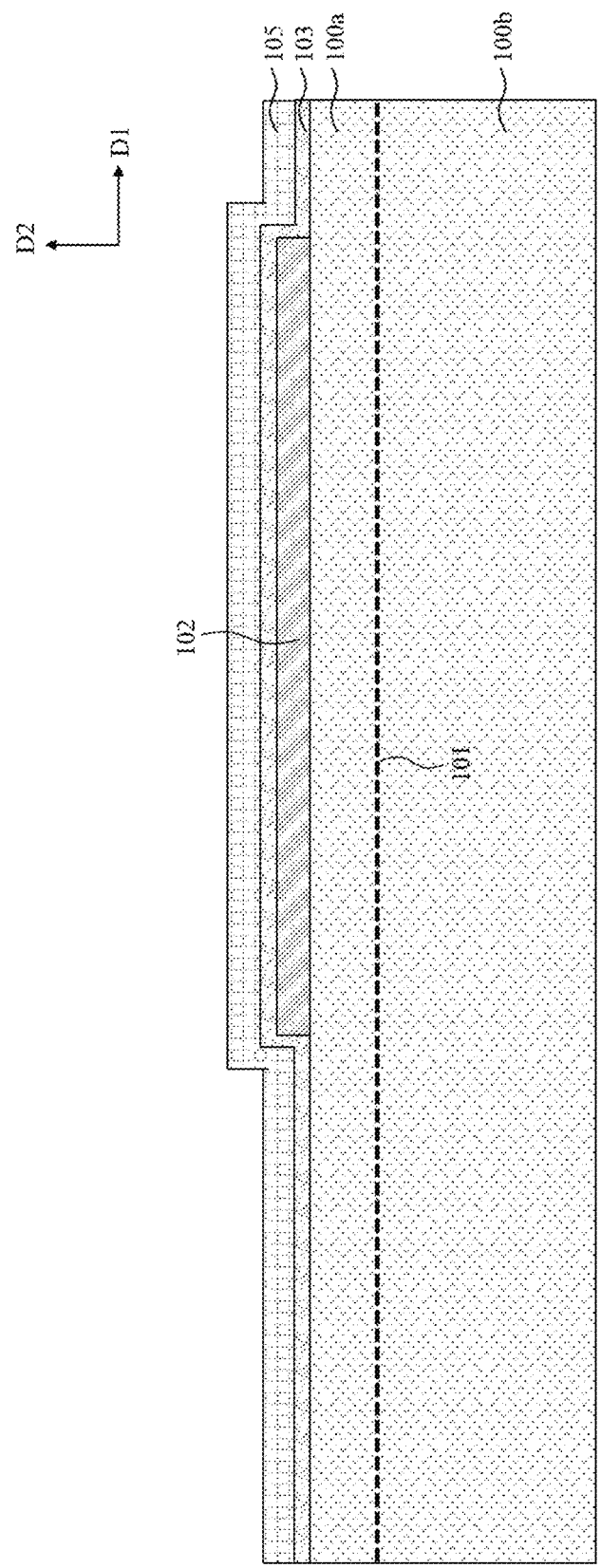

Referring to FIG. 5, thereafter, a sacrificial material layer 105 is formed on the passivation layer 103. The material of the sacrificial material layer 105 is different from the material of the passivation layer 103, and is configured to have a high etching selectivity ratio with respect to the passivation layer 103 in the subsequent etching process for forming the resonant cavity. For example, the material of the sacrificial material layer 105 is removed by the etching substance (e.g., $XeF_2$) in the etching process. In some embodiments, the sacrificial material layer 105 may include a semiconductor material, and may be a single-layer structure or a multi-layer structure, for example, the sacrificial material layer 105 may be or include silicon, polysilicon, amorphous silicon, the like, or a stacked layer including combinations of aforementioned materials. Alternatively or additionally, the sacrificial material layer 105 may also include other suitable materials having a high etching selectivity ratio with respect to the passivation layer and subsequently formed dielectric layer. The sacrificial material layer 105 may be formed by a deposition process such as chemical vapor deposition, physical vapor deposition, etc., and the process temperature for forming the sacrificial material layer 105 is also controlled within a temperature range lower than the temperature required for splitting along the cleavage plane, for example, the process temperature is controlled below 40 degrees Celsius.

Figure 6:
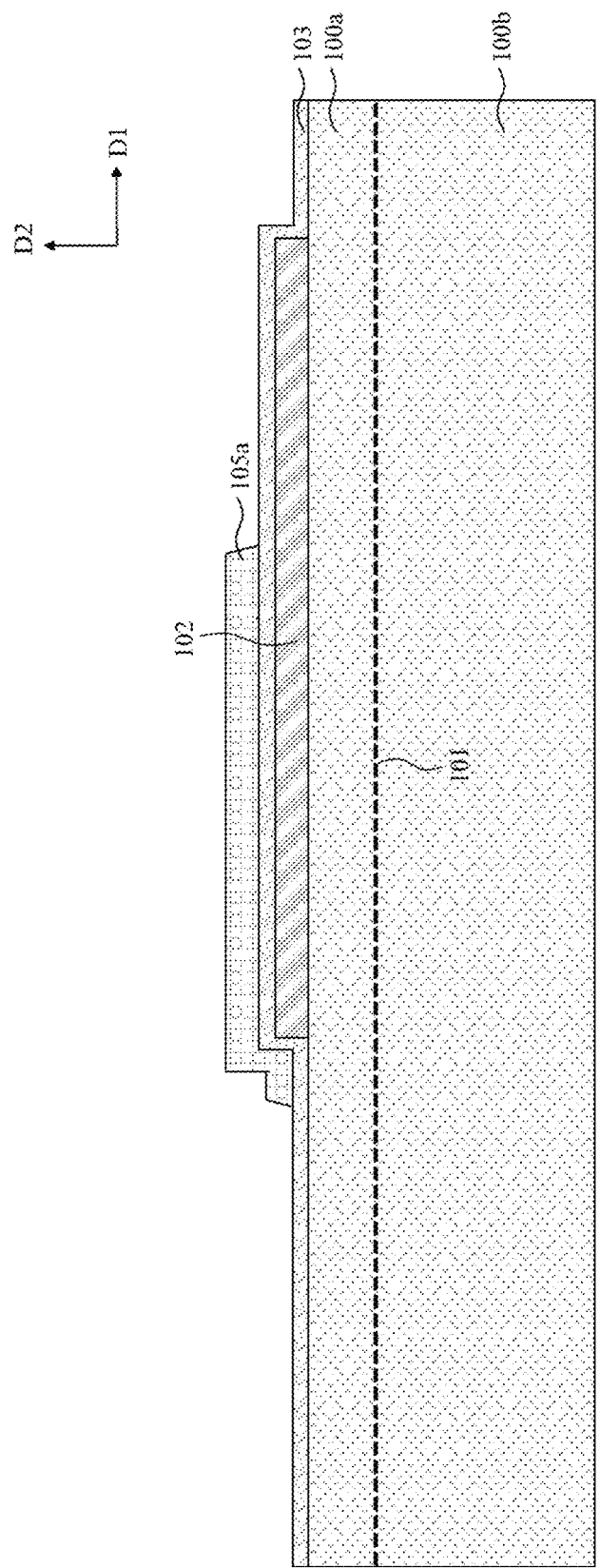

Referring to FIG. 5 to FIG. 6, a patterning process is performed on the sacrificial material layer 105 to form a sacrificial layer 105a. For example, photolithography and etching processes may be performed to pattern the sacrificial material layer 105, so as to remove a portion of the sacrificial material layer 105 (e.g., a portion adjacent to the edges of the piezoelectric substrate 100 or the electrode 102), and the sacrificial layer 105a is formed. The sacrificial layer 105a is, for example, configured to define the position of the subsequently formed cavity, and the region where the sacrificial layer 105a is located may be or be located in an effective resonant region of the subsequently formed resonator. In some embodiments, the sacrificial layer 105a covers a portion of the surface of the passivation layer 103 at the side away from the piezoelectric substrate 100, and is overlapped with at least a portion of the electrode 102 in a direction D2 (e.g., vertical direction) perpendicular to the main surface of the piezoelectric substrate 100. In some embodiments, the sacrificial layer 105a is overlapped with a portion of electrode 102 in the direction D2, and a portion of electrode 102 extends beyond a sidewall of the sacrificial layer 105 in the direction D1 and is not overlapped with the sacrificial layer 105a in the direction D2.

Figure 7:
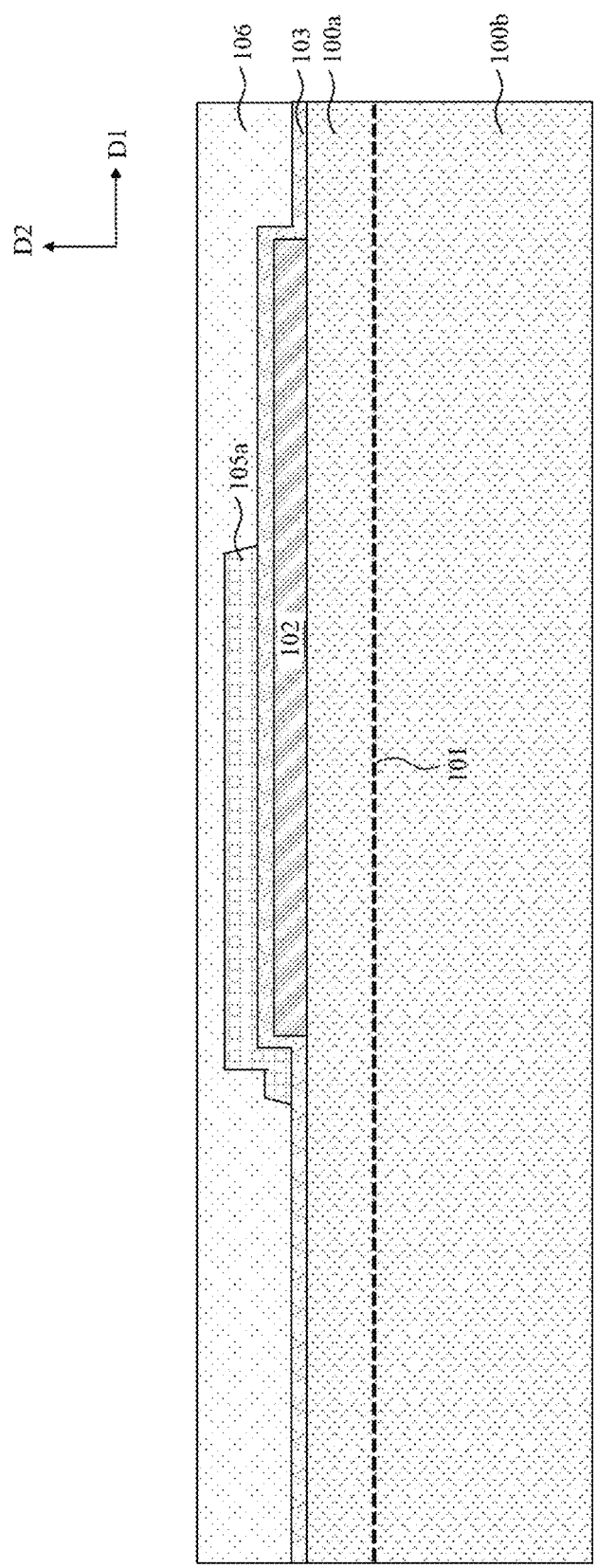

Referring to FIG. 6 to FIG. 7, a dielectric layer 106 is formed over the first portion 100a of the piezoelectric substrate 100 to cover the sacrificial layer 105a and the passivation layer 103. For example, the dielectric layer 106 covers the sidewalls of the sacrificial layer 105a and the surface of the sacrificial layer 105a at the side away from the piezoelectric substrate 100, and covers the surface of the passivation layer 103 at the side away from the piezoelectric substrate 100. The material of the dielectric layer 106 is different from the material of the sacrificial layer 105a, and may be the same as or different from the material of the passivation layer 103. For example, the dielectric layer 106 may include silicon oxide, silicon nitride, the like, or combinations thereof. The dielectric layer 106 may be formed by forming a dielectric material layer using a deposition process such as chemical vapor deposition, and then performing a planarization process (e.g., chemical mechanical polishing (CMP) process) on the dielectric material layer. The planarization process is performed such that the dielectric layer 106 has a substantially flat surface at the side away from the piezoelectric substrate 100. In some embodiments, the dielectric layer 106 is configured for bonding to another substrate structure, and may also be referred to as a bonding layer or a bonding dielectric layer.

Figure 8:
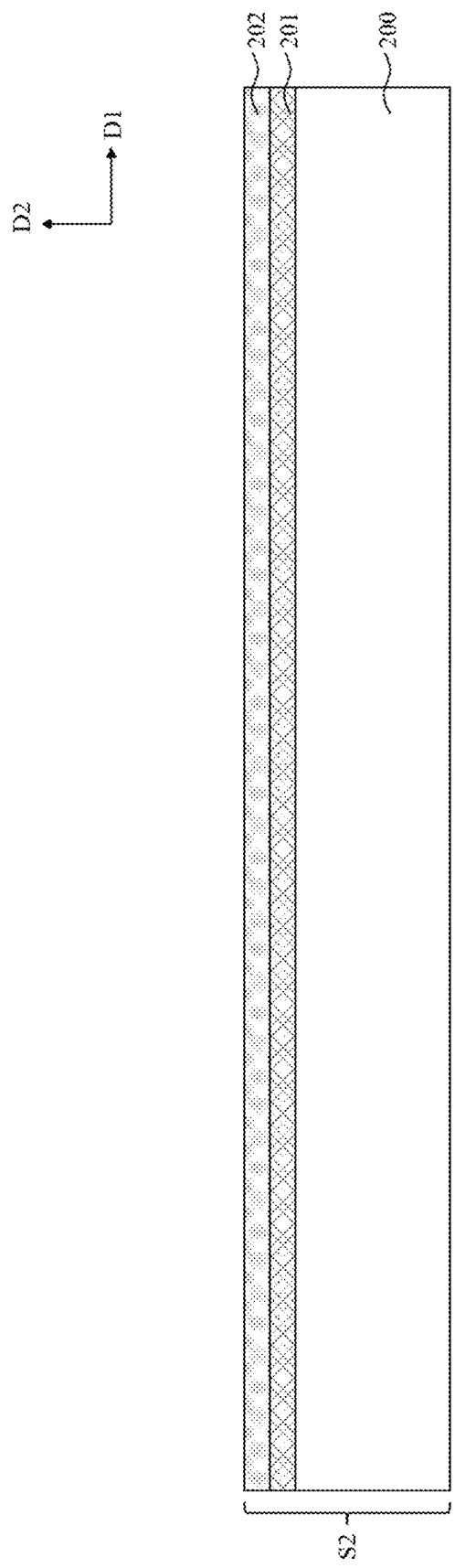

Referring to FIG. 8, in some embodiments, a substrate 200 is provided, and a barrier layer 201 and a buffer layer 202 are formed on the substrate 200 by a deposition process, for example. In some embodiments, the substrate 200, the barrier layer 201, and the buffer layer 202 constitute a substrate structure S2, which may be referred to as a second substrate structure. The substrate 200 may be referred to as a second substrate, and may also be referred to as a carrier substrate, such as a first carrier substrate. The substrate 200 may include a semiconductor material, a non-conductive material such as an insulating material, or combinations thereof. In some embodiments, the substrate 200 is a semiconductor substrate, and may include a suitable semiconductor material such as silicon. For example, the material of the substrate 200 may include a semiconductor material such as monocrystalline silicon, polysilicon, amorphous silicon, silicon carbide, gallium nitride, the like, or combinations thereof, but the present disclosure is not limited thereto. Alternatively or additionally, the substrate 200 may also include a non-conductive material, such as an insulating material (e.g., glass, aluminum oxide, or the like).

In some examples, the substrate 200 is a semiconductor substrate, and the material of the substrate 200 may include silicon, such as monocrystalline silicon. The barrier layer 201 is formed on a side of the substrate 200 in the direction D2, and is, for example, formed on the main surface of the substrate 200 and is in direct contact with the substrate 200. The barrier layer 201 serves as a charge accumulation preventing layer and is configured to prevent undesired conductive channel from being generated due to charge accumulation on the main surface of substrate 200. In the case where the substrate 200 is a monocrystalline silicon substrate, since monocrystalline silicon material may easily capture electrons from an electron-rich material, thereby accumulating charges and further forming a conductive channel on the surface of the monocrystalline silicon material, which may cause radio frequency loss of the resonator. In the embodiments of the present disclosure, through disposing the barrier layer to separate the substrate 200 from elements that may be formed of electron-rich materials, undesired conductive channel due to charge accumulation on the surface of the substrate 200 can be avoided.

The barrier layer 201 may be a single-layer structure or a multi-layer structure including at least two material layers. At least the surface layer of the barrier layer 201 in contact with the substrate 200 is a non-electron-rich layer, such as a non-conductive and non-silicon-oxide layer (silicon oxide is electron-rich). For example, the barrier layer 201 includes a non-conductive material, and may include a semiconductor material, a dielectric material, or a combination thereof. For example, the barrier layer 201 may include polysilicon, amorphous silicon, SiN, AlN, silicon carbide (SiC), GaN, silicon oxide ($SiO_2$), the like, or combinations thereof. It the case that the barrier layer 201 is a single-layer structure, the material of the barrier layer 201 does not include silicon oxide, that is, the material of the barrier layer 201 may be selected from the above-mentioned materials other than silicon oxide; in the case that the barrier layer 201 is a multi-layer structure, the surface layer of the barrier layer 201 in contact with the substrate 200 does not include silicon oxide, that is, may be selected from the above-mentioned materials other than silicon oxide, and the other layers of the barrier layer 201 (e.g., layers away from the main surface of the substrate 200) may be any material selected from the above-mentioned materials, and may include silicon oxide.

Through disposing the barrier layer 201, in the case that the substrate 200 is a monocrystalline silicon substrate, the surface of the substrate 200 can be prevented from contacting with an electron-rich material (e.g., silicon oxide) to form a contact interface between the semiconductor material and the electron-rich material (e.g., a contact interface between monocrystalline silicon and silicon oxide) that may generate charge accumulation, so as to avoid the formation of undesired conductive channel due to charge accumulation on the surface of the substrate 200, thereby avoiding the radio frequency loss resulted from the undesired conductive channel, and improving the quality factor and performance of the resonator.

In some embodiments, a native oxide layer (e.g., native silicon oxide layer) may be existed on the substrate 200. Since silicon oxide is an electron-rich material, a cleaning process is performed on the substrate 200 before forming the barrier layer 201 to completely remove the native oxide layer on the surface of the substrate 200, such that the formed barrier layer 201 is in direct contact with the semiconductor material (e.g., silicon) of the substrate 200, without an electron-rich material (e.g., oxide layer) or a contact interface between a semiconductor material (e.g., monocrystalline silicon) and electron-rich material (e.g., silicon oxide) existed therebetween, thereby preventing undesired conductive channel from being generated due to charge accumulation on the main surface of the substrate 200. In some embodiments, the cleaning process may include an etching process, such as a wet etching and/or a dry etching.

In some embodiments, a buffer layer 202 is disposed on a side of the barrier layer 201 away from the substrate 200. The buffer layer 202 is a non-conductive material, which may include a suitable dielectric material, such as silicon nitride (SiN), silicon oxide ($SiO_2$), aluminum nitride (AlN), the like, or combinations thereof. The buffer layer 202 may be a single-layer structure or a multi-layer structure. In the case that the buffer layer 202 is a multi-layer structure, it may be a stacked layer including a combination of two or more of the above-mentioned materials. In this embodiment, the buffer layer 202 is configured to create a good bonding interface condition (e.g., with a surface material and surface flatness suitable for bonding), and may be configured to balance the warpage degree of the substrate 200 (or control the warpage degree of the substrate structure S2), so that the substrate structure S2 has a substantially flat surface. For example, one of the buffer layer 202 and the barrier layer 201 has tensile stress, while the other one of the buffer layer 202 and the barrier layer has compressive stress, so that the warpage of the substrate 200 can be balanced and the warpage degree of the substrate structure S2 can be controlled. The buffer layer 202 has, for example, a substantially flat surface (e.g., the surface on the side away from the carrier substrate) to facilitate subsequent bonding process. In the embodiments of the present disclosure, since the buffer layer 202 is disposed on the barrier layer 201, and the buffer layer 202 has a substantially flat surface, the subsequent bonding of the buffer layer 200 to the dielectric layer 106 can be facilitated. In the embodiments where the buffer layer 202 includes silicon oxide, since the barrier layer 201 is disposed between the buffer layer 202 and the substrate 200 to space the buffer layer 202 and the substrate 200 apart from each other, the substrate 200 would not be in direct contact with the buffer layer 202, as such, there is also no contact interface between monocrystalline silicon and silicon oxide on the surface of the substrate 200, thereby avoiding undesired conductive channel from being generated due to charge accumulation at the contact interface between monocrystalline silicon and silicon oxide. In some embodiments, for example, in the case where the barrier layer 201 has conditions suitable for bonding, the buffer layer 202 may also be omitted, that is, the buffer layer 202 is optionally formed on the barrier layer 201.

Figure 9:
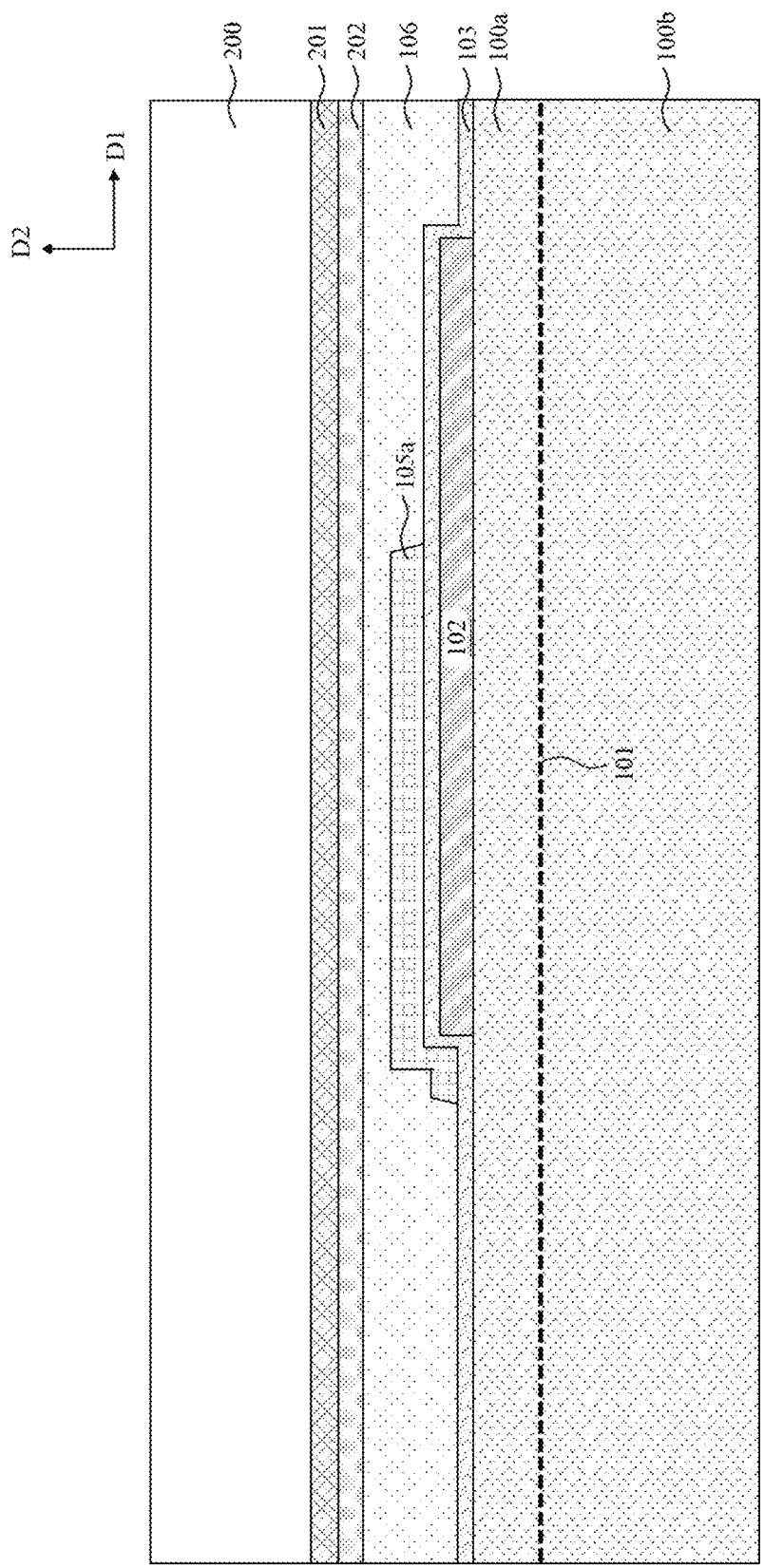

Referring to FIG. 7 to FIG. 9, the structure of FIG. 7 and the structure of FIG. 9 are bonded together through a bonding process; for example, the substrate structure S2 of FIG. 8 is turned over, and a bonding process is performed, such that the buffer layer 202 of substrate structure S2 and the dielectric layer 106 over the piezoelectric substrate 100 in the structure shown in FIG. 7 are bonded together. The bonding process may, for example, include a fusion bonding process, and the buffer layer 202 and the dielectric layer 106 may be bonded together, for example, by dielectric-to-dielectric bonding, but the present disclosure is not limited thereto. Any other suitable bonding process may also be used in this embodiment. In some embodiments, since the buffer layer 202 is disposed on the barrier layer 201 to create a good bonding condition, for example, the buffer layer 202 has a material and surface flatness, etc., suitable for bonding, the buffer layer 202 and the dielectric layer 106 have a high quality bonding interface therebetween. In some other embodiments, after the barrier layer 201 is formed on the substrate 200, the surface of the barrier layer 201 has conditions suitable for bonding and has a substantially flat surface, therefore, the buffer layer 202 can be omitted, such that the barrier layer 201 and the dielectric layer 106 are bonded together.

In conventional resonators, a semiconductor substrate (e.g., a monocrystalline silicon substrate) is directly bonded to a bonding dielectric layer, from which the substrate may trap free charges (e.g., electrons), resulting in that an conductive channel is formed due to charge accumulation generated at the contact interface between the semiconductor substrate and the bonding dielectric layer, which may cause RF loss in the resonator, thereby reducing the quality factor and performance of the resonator. Compared with the conventional resonators, in the embodiments of the present disclosure, the substrate 200 and the dielectric layer 106 are separated by at least the barrier layer 201, without being directly bonding to each other, so that an undesired conductive channel can be prevented from being formed due to charge accumulation on the main surface of the substrate 200 at a side close to the dielectric layer 106, thereby improving the quality factor and performance of the resonator.

Figure 10:
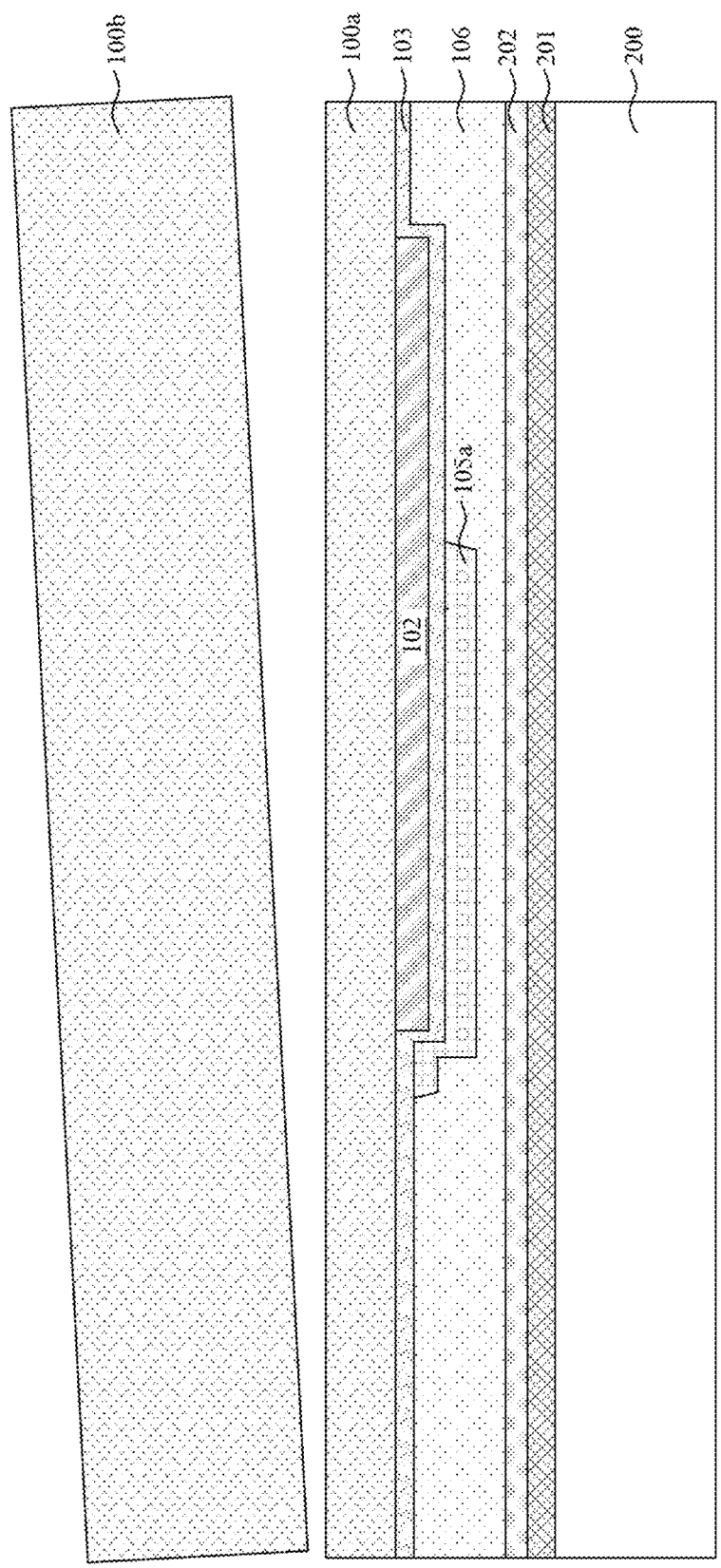

Referring to FIG. 9 and FIG. 10, the piezoelectric substrate 100 is split along the cleavage plane 101, so that the first portion 100a and the second portion 100b are separated from each other. In some embodiments, the split of the piezoelectric substrate 100 may be caused by performing an annealing process on the piezoelectric substrate 100, for example, the structure of FIG. 9 is turned over, and an annealing process is then performed on the piezoelectric substrate 100, for example, at a temperature of 400 to 650 Celsius degree. In some embodiments in which the cleavage plane 100 is defined by implanting hydrogen ions in the piezoelectric substrate 100, the hydrogen form bubbles inside the piezoelectric substrate 100 during the annealing process, thereby generating a hydrogen stripping layer in the piezoelectric substrate 100 along the cleavage plane 101, and causing the piezoelectric substrate 100 to split along the hydrogen stripping layer. In some embodiments, the split of the piezoelectric substrate 100 may also be caused by mechanical force in addition to or instead of annealing. The split of the piezoelectric substrate 100 removes the second portion 100b and remains the first portion 100a for forming the piezoelectric layer.

Figure 11:
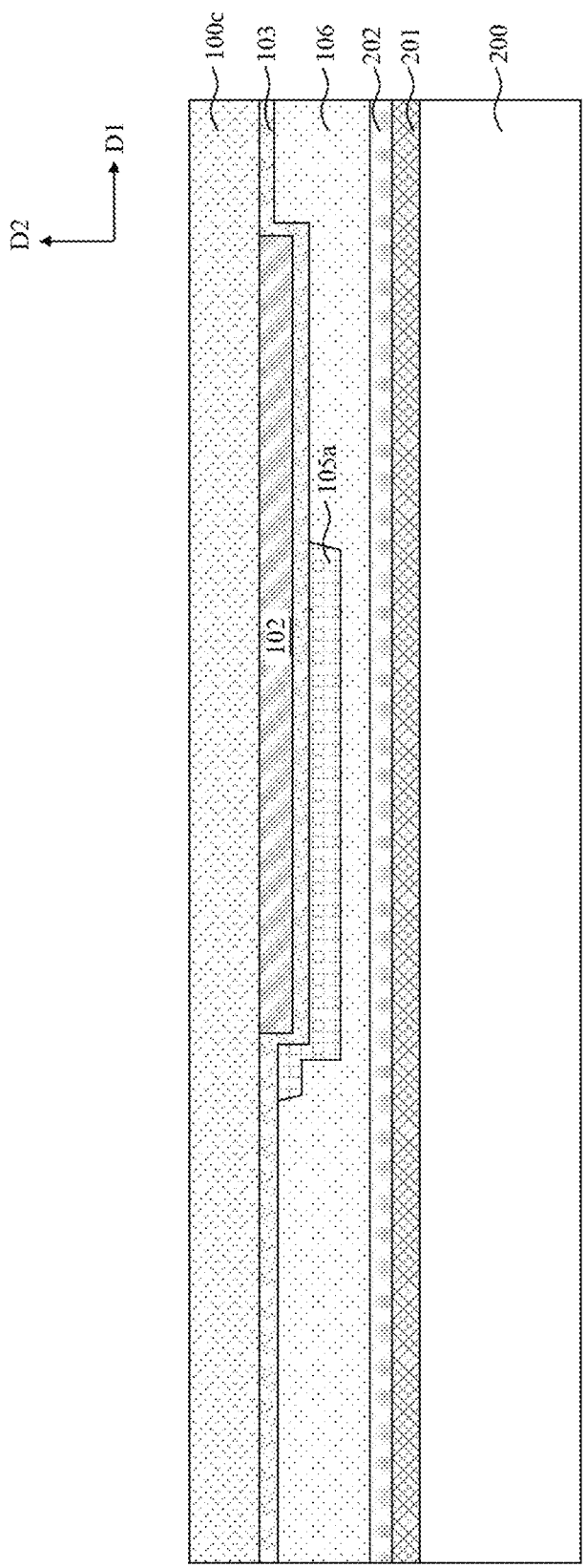

Referring to FIG. 10 and FIG. 11, in some embodiments, after removing the second portion 100b, a planarization process (e.g., CMP) may be optionally performed on the first portion 100a to form a piezoelectric layer 100c having a substantially flat surface 100c. In some embodiments, after the annealing process is performed to split the piezoelectric substrate 100, the exposed surface layer of the first portion 100a (i.e., at a location away from the electrode 102 and previously close to the cleavage plane 101) may have a small amount of residual cleavage ions (H/He ions) therein, and this surface layer including the residual ions is removed in the above-mentioned planarization process, such that the piezoelectric layer 100c is substantially free of residual H or He ions, and has a good piezoelectric property.

In some embodiments, a thickness measurement of the piezoelectric layer 100c may be performed to ensure that the piezoelectric layer 100c has the appropriate thickness required for the device. It should be understood that the thickness of the piezoelectric layer 100c refers to the thickness thereof in a direction (e.g., direction D2) perpendicular to the main surface of the substrate 200. In some embodiments, the planarization process is performed until the piezoelectric layer 100c has the required thickness. In alternative embodiments, the planarization process is performed until the piezoelectric layer 100c has a thickness close to the required thickness, and thereafter, a suitable removal method such as an ion beam etching (IBE) or ion beam trimming process may be performed to remove a portion of the piezoelectric layer, so that the thickness of the piezoelectric layer 100c precisely reaches the required thickness and the thickness is more uniform.

Figure 12:
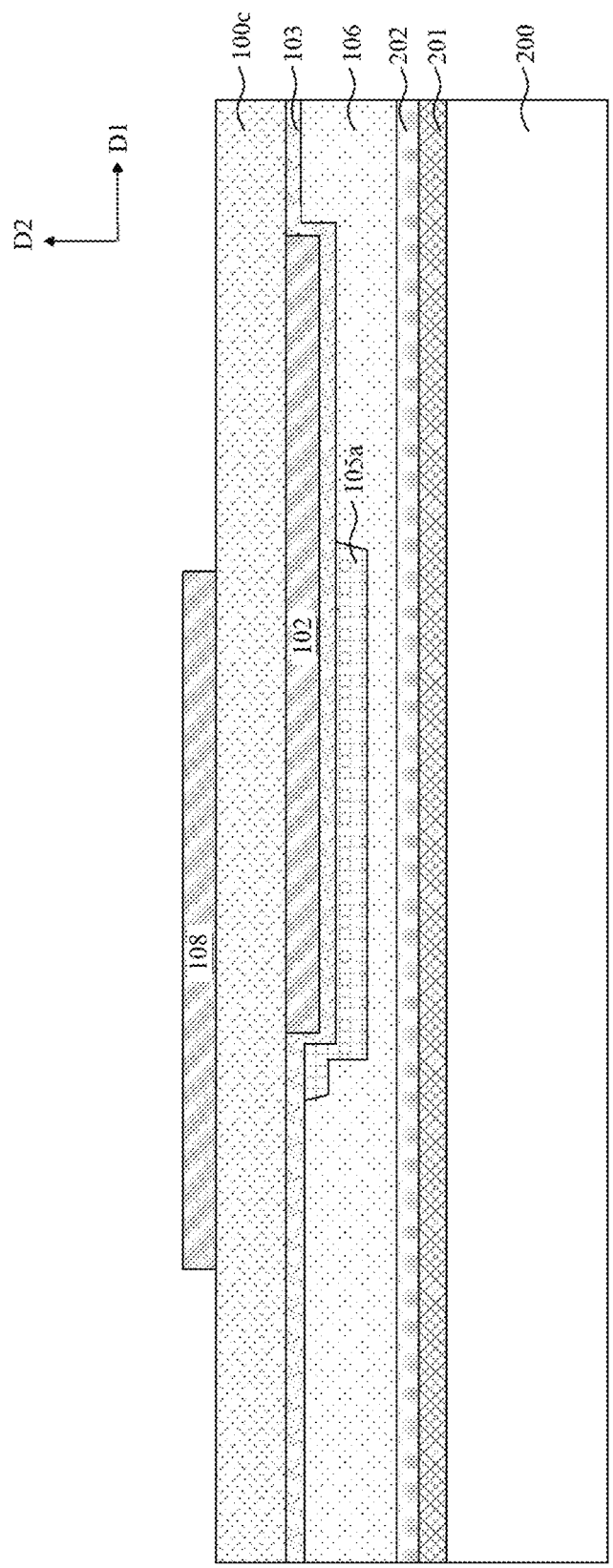

Referring to FIG. 12, an electrode 108 is formed on a side of the piezoelectric layer 100c away from the electrode 102. The material of electrode 108 may be selected from the candidate materials the same as those of electrode 102, and may be the same as or different from the material of electrode 102. For example, the electrode 108 includes a metal material such as molybdenum (Mo), aluminum (Al), copper (Cu), platinum (Pt), tantalum (Ta), tungsten (W), palladium (Pd), ruthenium (Ru), the like, alloys thereof, or combinations thereof. The electrode 108 is formed by, for example, forming an electrode material layer on the piezoelectric layer 100c through a deposition process such as physical vapor deposition (PVD), and then performing a patterning process on the electrode material layer. In some embodiments, the electrode 108, the electrode 102 and the sacrificial layer 105a are overlapped (e.g., partially overlapped) with each other in the direction D2. The electrode 102 and the electrode 108 may be referred to as a first electrode and a second electrode, respectively, or vice versa.

Figure 13:
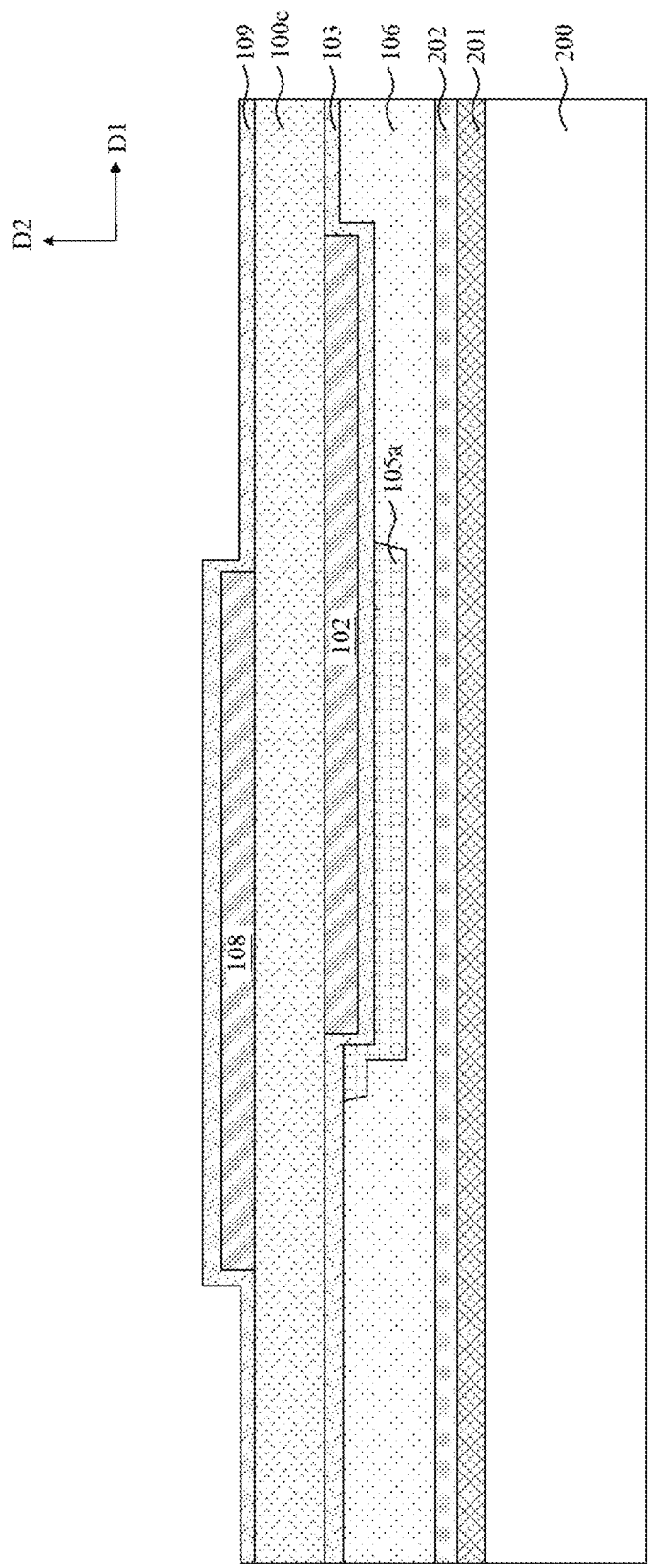

Referring to FIG. 13, a passivation layer 109 is formed on a side of the piezoelectric layer 100c away from the electrode 102 to cover the electrode 108. For example, the passivation layer 108 may completely cover the sidewalls of the electrode 108 and the surface of the electrode 108 at the side away from the piezoelectric layer 100c. In some embodiments, the passivation layer 109 is configured to protect the electrode 108 from being corroded by etching process, during a subsequent etching process for forming the resonant cavity, and the passivation layer 109 is formed from a material that is substantially not corroded by the etching process. For example, the etching process uses $XeF_2$ as an etching substance, and the material of the passivation layer 109 is not etched by $XeF_2$. The passivation layer 109 may be selected from the same candidate materials as those of passivation layer 103, and may include a material the same as or different from the material of the passivation layer 103. In some embodiments, the passivation layer 109 includes a non-metallic material, such as a dielectric material. For example, the passivation layer 109 may include aluminum nitride, silicon nitride, silicon oxide, the like, or combinations thereof, and may be a single-layer structure, or a multi-layer structure including a stack of combinations of the above-mentioned materials. The passivation layer 109 may be formed by, for example, a deposition process such as CVD.

Figure 14A:
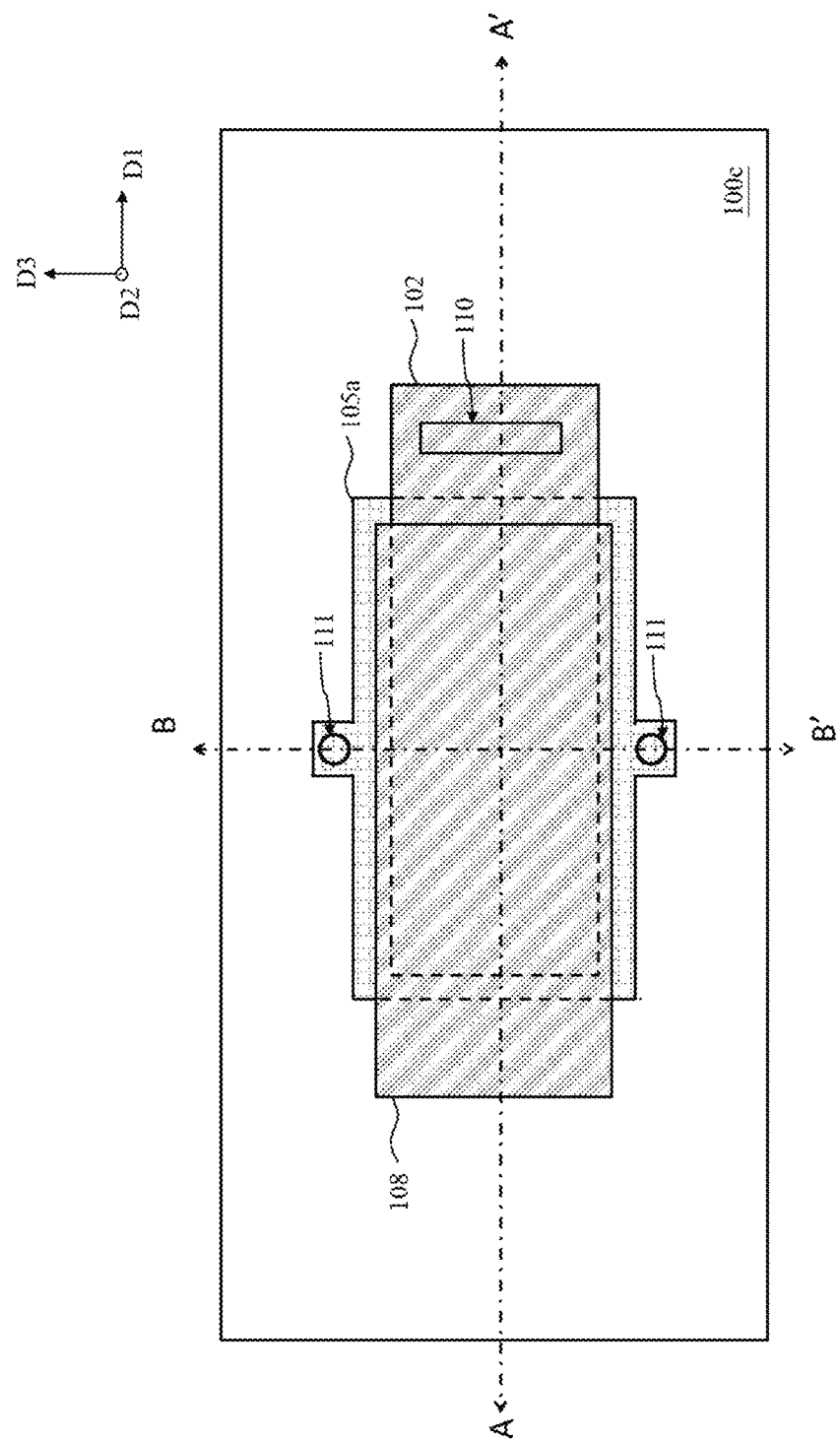
Figure 14B:
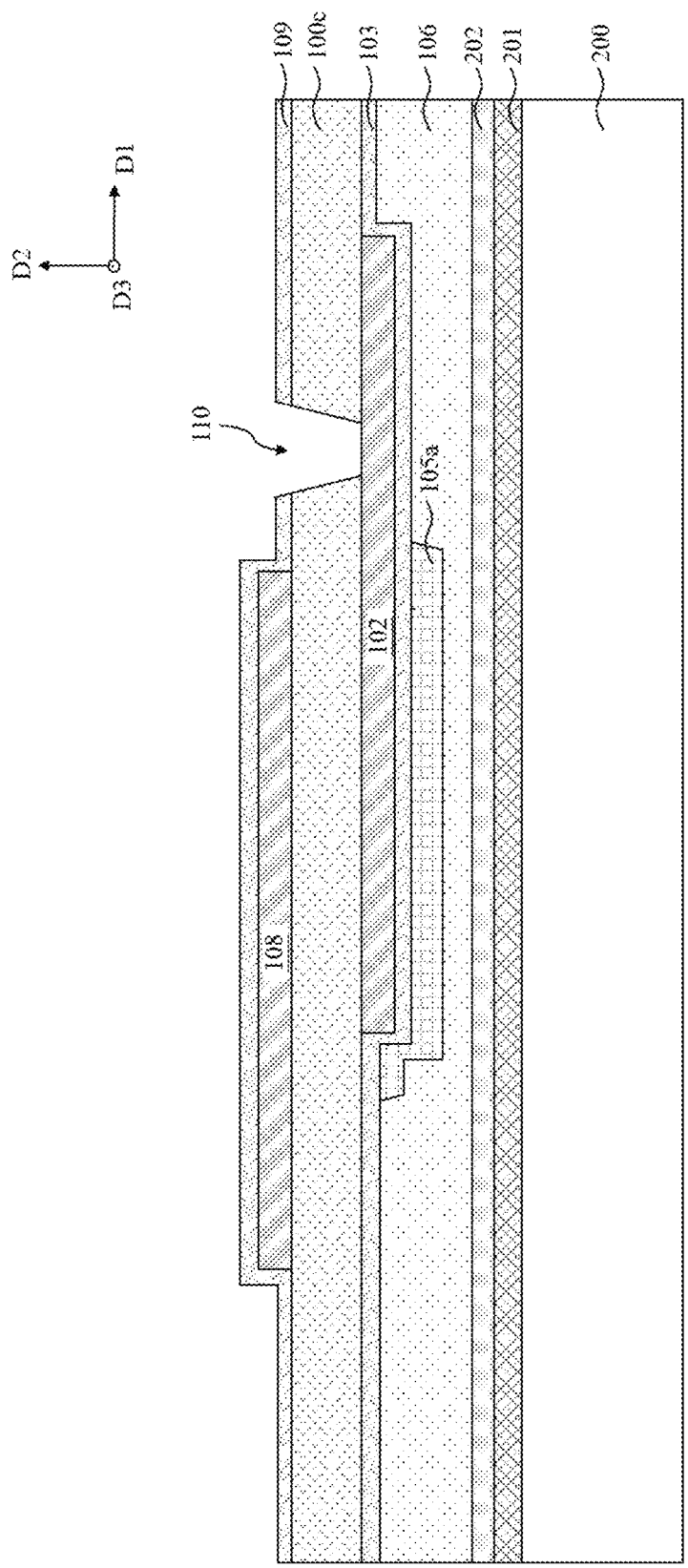
Figure 14C:
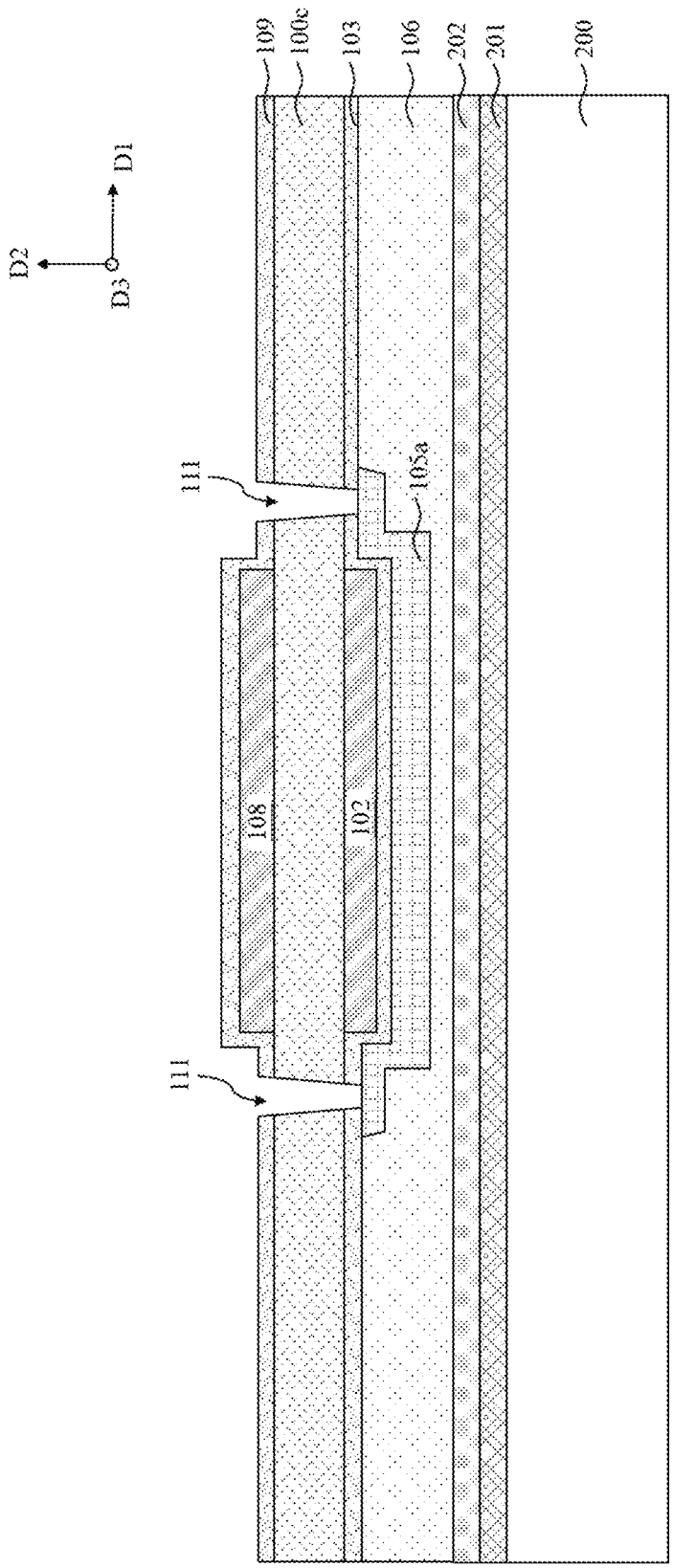

FIG. 14A to FIG. 14C are schematic top views and cross-sectional views illustrating processes of forming via holes and release holes after forming the passivation layer according to some embodiments of the present disclosure. FIG. 14B is a cross-sectional view taken along a line A-A' of the top view FIG. 14A, and FIG. 14C is a cross-sectional view taken along a line B-B' of FIG. 14A. It should be noted that, for the sake of clarity of the drawings, in FIG. 14A, only some components such as the piezoelectric layer 100c, the electrodes 102 and 108, and the sacrificial layer 105a are illustrated, while other components (e.g., passivation layers) are not specifically shown in FIG. 14A, and the electrode 102 and sacrificial layer 105a covered by the piezoelectric layer 100c are shown as visible, in which a portion of the electrode 102 that is overlapped with the electrode 108 in the direction D2 (i.e., the portion of the electrode 102 directly below the electrode 108 in the direction D2 in FIG. 14B) is shown in dotted lines, and a portion of the sacrificial layer 105a that is overlapped with the electrodes 102 and 108 in the direction D2 (i.e., the portion of the sacrificial layer 105a located directly below the electrodes 102 and 108 in the direction D2 in the cross-sectional view) is shown in dotted lines.

Referring to FIG. 13 and FIG. 14A to FIG. 14C, in some embodiments, a patterning process is performed on the passivation layer 109, the piezoelectric layer 100c and the passivation layer 103, so as to form a via hole 110 (FIG. 14A and FIG. 14B) in the passivation layer 109 and the piezoelectric layer 100c, and form release holes 111 (FIG. 14A and FIG. 14C) in the passivation layer 109, the piezoelectric layer 100c and the passivation layer 103. The patterning process may include the following processes, a patterned mask layer (not shown) is formed on a side of the passivation layer 109 away from the piezoelectric layer 100c, the patterned mask layer has a first opening directly over the electrode 102 and second openings directly over the sacrificial layer 105a, with the positions of the second openings being shifted from the electrode 102 in the horizontal direction (e.g., a direction D3 intersecting with or perpendicular to the direction D1); thereafter, an etching process is performed on the passivation layer 109, the piezoelectric layer 100c and the passivation layer 103 using the patterned mask layer as an etching mask, so as to remove portions of the passivation layer 109 and the piezoelectric layer 100c exposed by the first opening of the mask layer and form the via hole 110 extending through the passivation layer 109 and the piezoelectric layer 100c and exposing a portion of the surface of the electrode 102; and to remove portions of the passivation layer 109, the piezoelectric layer 10c, and the passivation layer 103 exposed by the second openings of the mask layer, and form the release holes III extending through the passivation layer 109, the piezoelectric layer 100c and the passivation layer 103 and exposing portions of the surface of the sacrificial layer 105a. The etching process has a high etching selectivity to the materials of the passivation layers 109, 103 and the piezoelectric layer 100c, while the electrode 102 and the sacrificial layer 105a serve as etching stop layers during the etching process, such that the etching process is performed until the electrode 102 and the sacrificial layer 105a are exposed.

In some embodiments, when viewed in the cross-sectional views FIG. 14B and FIG. 14C, the sidewalls of the via hole 110 and the release hole 111 may be inclined or straight, and the cross-sectional shapes of the via hole 100 and the release hole 111 may be trapezoidal, square or rectangle; when viewed in the plan view (FIG. 14A), the shape of the via hole 110 may be a rectangle, a rectangle with rounded corners or any other suitable shape, and the shape of the release hole 111 is, for example, a circle, an ellipse or any suitable shape. It should be understood that, the above-mentioned shapes of the via hole and the release hole are merely for illustration, and the present disclosure is not limited thereto. In some embodiments, one or more release holes 111 are formed in the passivation layer 109, the piezoelectric layer 100c, and the passivation layer 103, and the number of the release hole(s) 11 is not limited in the present disclosure.

Figure 15:
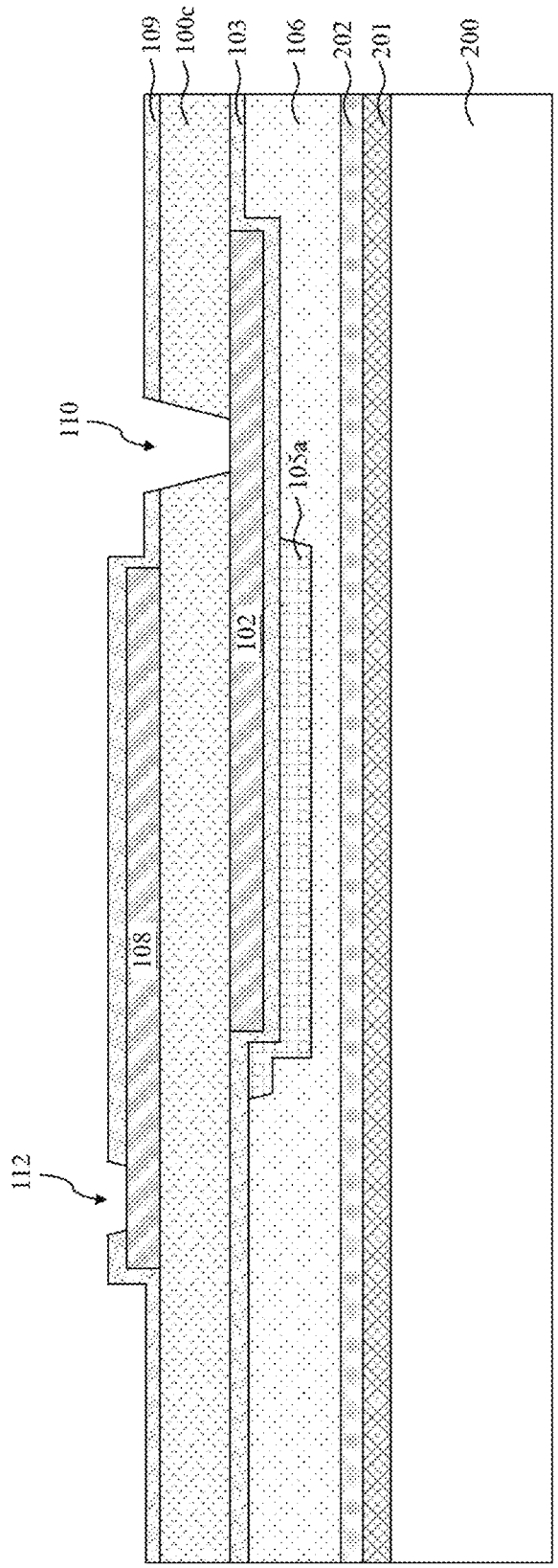

Referring to FIG. 15, a patterning process is performed on the passivation layer 109 to form a via hole 112 extending through the passivation layer 109, the via hole 112 exposes a portion of the surface of the electrode 108 at the side away from the piezoelectric layer 100c. The patterning process may include performing an etching process on the passivation layer 109 using a patterned mask layer.

Figure 16A:
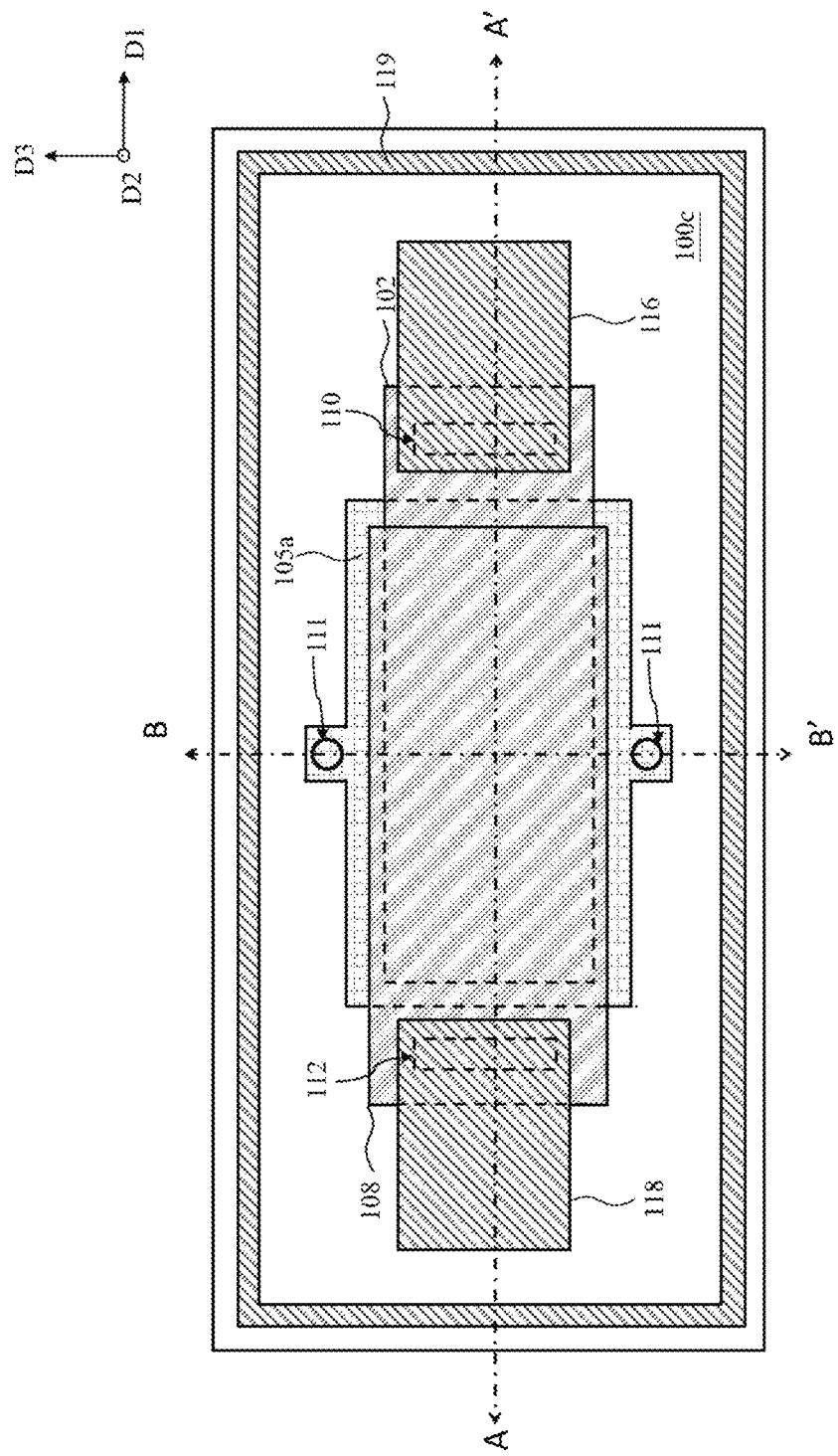
Figure 16B:
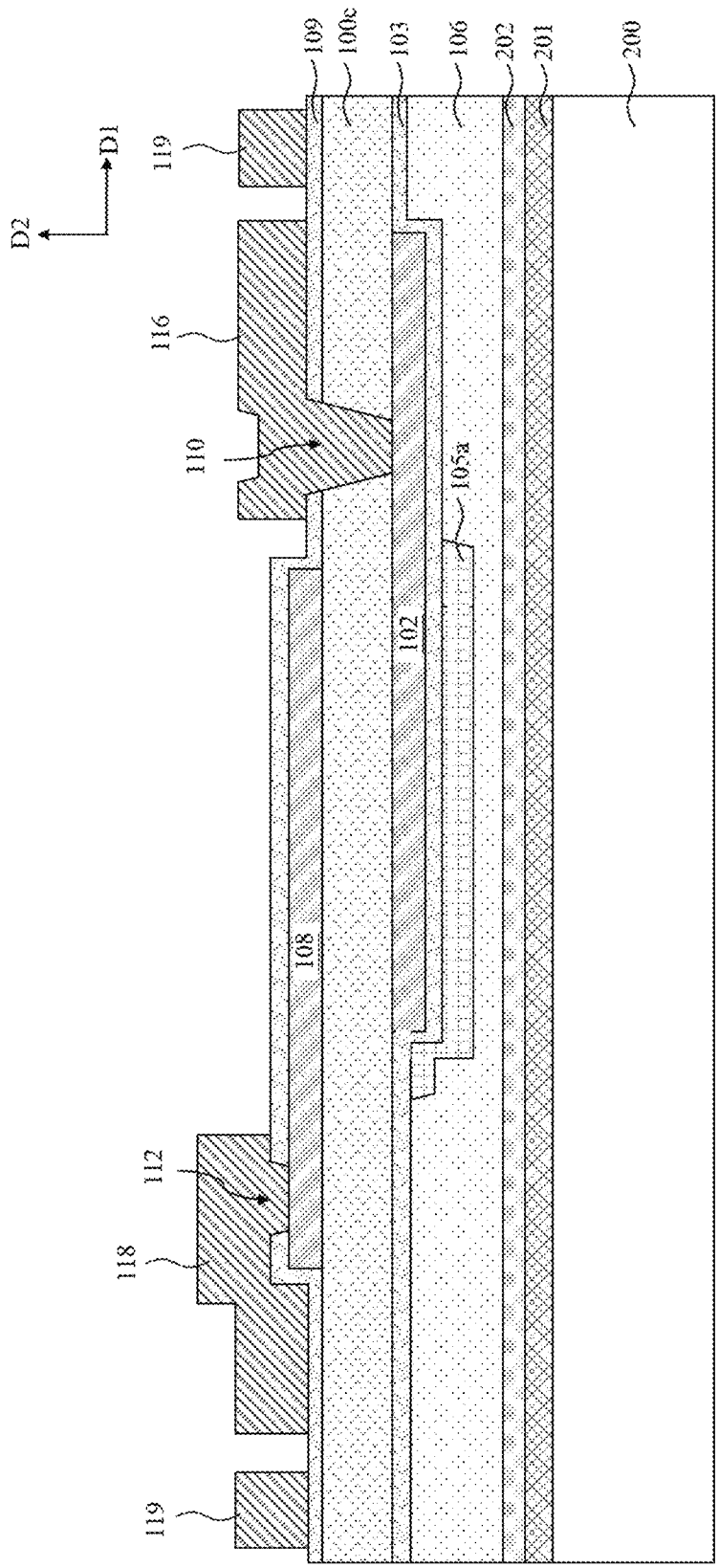
Figure 16C:
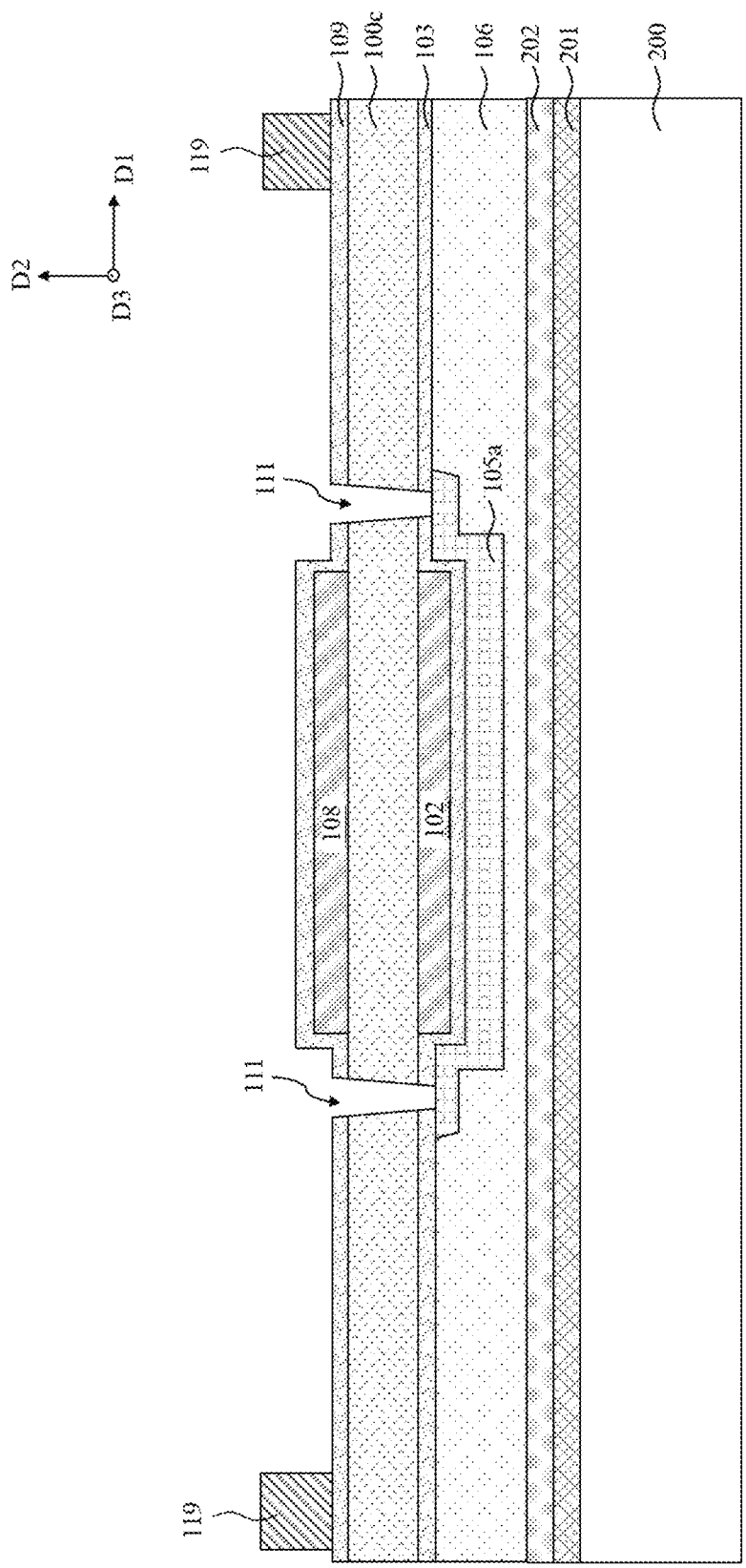
Figure 17A:
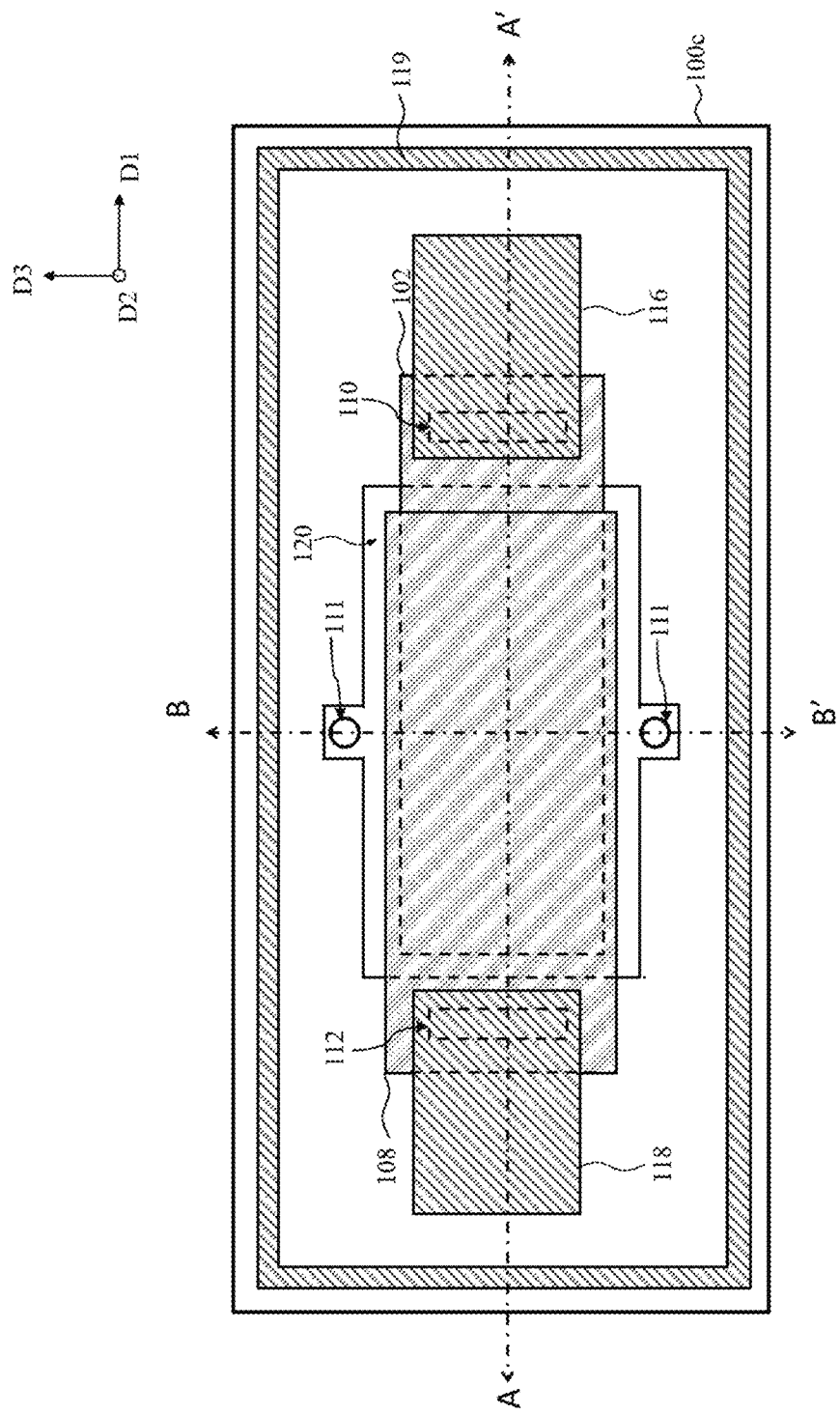
Figure 17B:
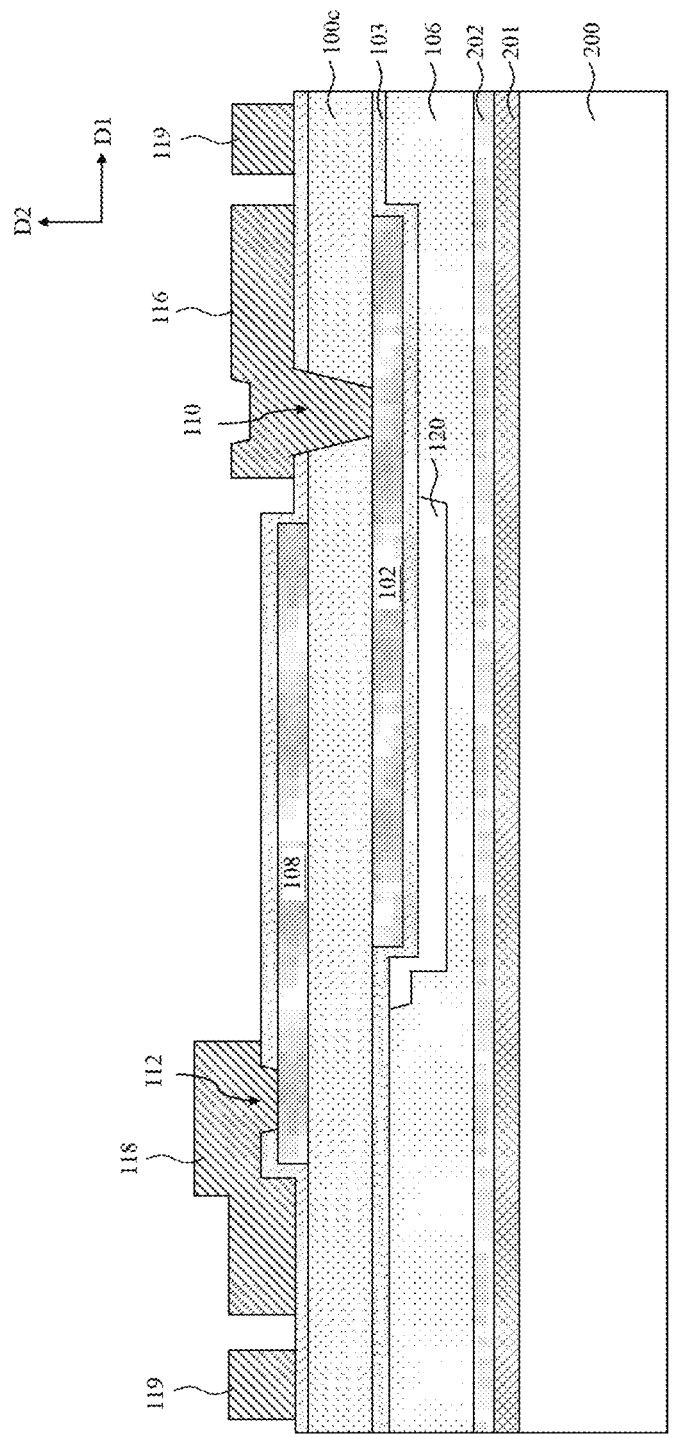
Figure 17C:
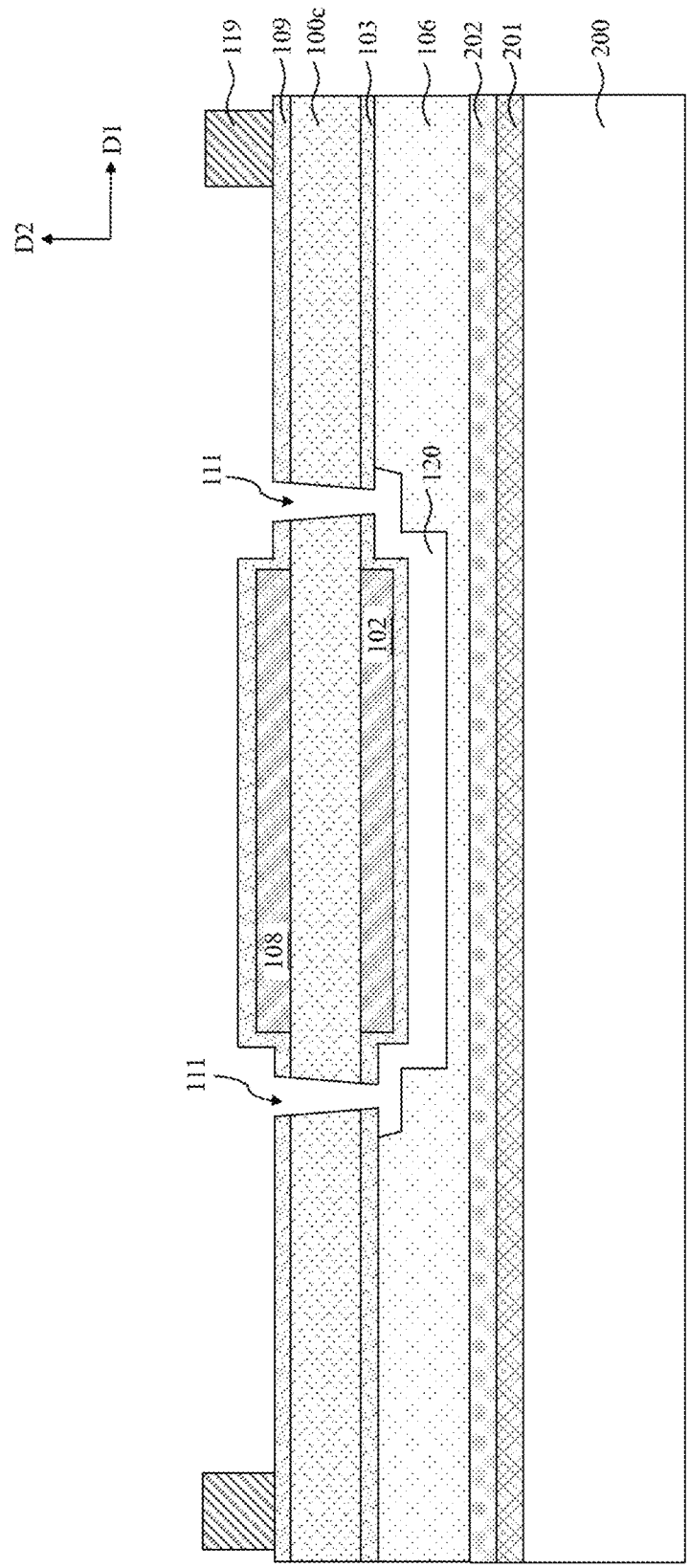

FIG. 16A to FIG. 16C and FIG. 17A to 17C are schematic top views and cross-sectional views illustrating intermediate structures in subsequent process steps. FIG. 16B and FIG. 17B are cross-sectional views taken along the lines A-A' of the top views FIG. 16A and FIG. 17A, respectively, and FIG. 16C and FIG. 17C are cross-sectional views taken along the lines B-B' of the top view FIG. 16A and FIG. 17A, respectively.

Referring to FIG. 16A to FIG. 16C, conductive connectors 116 and 118 are respectively formed to fill into the via holes 110 and 112. The conductive connectors 116 and 118 respectively extend through the via holes 110 and 112 to be electrically connected to the electrodes 102 and 108. The portions of electrodes 102 and 108 that are connected to conductive connectors 116 and 118 may be referred to as electrode lead-out parts (e.g., respectively referred to as a first electrode lead-out part and a second electrode lead-out part). In some embodiments, the conductive connector 116 is filled into the via hole 110 and protrude from the top surfaces (i.e., the surfaces at the side away from the electrode 102) of the piezoelectric layer 100c and the passivation layer 109. For example, the conductive connector 116 includes a conductive via portion located in the via hole 110 and a protruding portion (e.g., pad portion) located outside the via hole 110 and extending along the surface of the passivation layer 109 at the side away from the piezoelectric layer 100c. Similarly, the conductive connector 118 is filled in the via hole 112 and protrudes from the top surface (i.e., the surface at the side away from the piezoelectric layer 100c) of the passivation layer 109. For example, the conductive connector 118 includes a conductive via portion located in the via hole 112 and a protruding portion (e.g., pad portion) located outside the via hole 112 and extending along the surface of the passivation layer 109 at the side away from the piezoelectric layer 100c. The conductive connectors 116 and 118 include conductive materials, such as metallic materials, such as aluminum, copper, gold, titanium, tungsten, platinum, the like, alloys thereof, or combinations thereof.

In some embodiments, a bonding seal ring portion 119 is further formed. For example, the bonding seal ring portion 119 is located over the edge of the piezoelectric layer 100c, and may be ring-shaped, and laterally surround the components (e.g., the conductive connecters 116, 118, the electrode 108, etc.) located in the region away from the edge region in a direction (e.g., horizontal direction) substantially parallel to the main surface of the substrate 200 or the piezoelectric layer 100c. The bonding seal ring portion 119 is used for bonding in a subsequent process and may also be referred to as an edge bonding seal ring portion. In some embodiments, the bonding seal ring portion 119 includes a metallic material such as aluminum, copper, gold, titanium, tungsten, platinum, the like, alloys thereof, or combinations thereof, and the material of the bonding seal ring portion 119 may be the same as or different from the materials of the conductive connectors 116 and 118. The conductive connectors 116 and 118 and the bonding seal ring portion 119 are spaced apart from each other. In some embodiments, the bonding seal ring portion 119 is electrically floating, that is, the bonding seal ring portion 119 is electrically isolated from other conductive components such as the conductive connectors 116, 118. In some embodiments, the conductive connectors 116 and 118 and the bonding seal ring portion 119 are formed from the same material and are formed simultaneously by a same manufacturing process, such as formed by one patterning process performed on a same metal material layer.

For example, the method of forming the conductive connectors 116 and 118 and the bonding seal ring portion 119 may include the following processes. A seed layer (not shown) is formed over the piezoelectric substrate 200 by sputtering, for example. The seed layer may include titanium/copper; the seed layer extends along the surface of the passivation layer 109 and fills into the via holes 110 and 112 and the release holes 111, and a patterned mask layer is then formed on the seed layer to cover portions of the seed layer on the passivation layer 109 and in the release holes 111, the pattern mask layer has openings at the positions corresponding to the conductive connectors 116 and 118 and the bonding seal ring portion 119 that are to be formed. That is, the patterned mask layer exposes the via holes 110 and 112 and portions of the top surface of the seed layer close to the via holes 110 and 112, and exposes a portion of the surface of the seed layer on the edge of the passivation layer 109; thereafter, a metal layer (e.g., copper) is formed on the seed layer exposed by the openings of the patterned mask layer; the patterned mask layer is removed, and portions of the seed layer not covered by the metal layer are removed using the metal layer as an etching mask, while the metal layer and the remained seed layer underlying thereof constitute the conductive connectors 116 and 118 and the bonding seal ring portion 119.

The above-mentioned forming processes of the conductive connectors 116 and 118 and the bonding seal ring portion 119 are merely for illustration, and the present disclosure is not limited thereto. In some other embodiments, the bonding seal ring portion 119 may also be formed from a material different from those of the conductive connectors 116 and 119, and may be formed sequentially with the conductive connectors 116 and 118, that is, the bonding seal ring portion 119 may be formed in a separate patterning process.

In the above embodiment, the release holes Ill are formed by the same one patterning process as the via holes 110 and 112 before forming the conductive connectors 116 and 118 and the bonding seal ring portion 119, but the present disclosure is not limited thereto. In alternative embodiments, the release holes 111 may also be formed by a separate patterning process after forming the conductive connectors 116/118 and the bonding seal ring portion 119.

Referring to FIG. 16A to FIG. 16C and FIG. 17A to FIG. 17C, the sacrificial layer 105a is then removed to form a cavity 120 at the position previously occupied by the sacrificial layer 105a. In some embodiments, the cavity 120 is a resonant cavity, and may also be referred to as a first cavity. The forming method of the cavity 105c includes, for example, removing the sacrificial layer 105a through an etching process. The etching process may include a dry etching process, and may alternatively or additionally include a wet etching process. For example, an etching substance is applied to the region where the to-be-removed sacrificial layer 105a is located through the release holes 111, so as to remove the sacrificial layer 105a and form the cavity 120 at the position previously occupied by the sacrificial layer 105a. In some embodiments, the etch process uses $XeF_2$ plasma as the etching substance to remove the sacrificial layer 105a. Since the materials of the passivation layers 109, 103 and the dielectric layer 106 are selected from materials that are not corroded by the etching substance (e.g., $XeF_2$) used in the etching process, the passivation layers 109, 103 and the dielectric layer 106 are substantially not removed or corroded during the etching process. That is to say, the etching substance used in the etching process has a high etching selectivity ratio of the sacrificial layer 105a to the passivation layers 109/103 and the dielectric layer 106. On the other hand, in the embodiments of the present disclosure, since the sidewalls of the electrode 102 and the surface of the electrode 102 at the side away from the piezoelectric layer 100c and close to the cavity 120 are covered (e.g., completely covered) by the passivation layer 103, and the sidewalls of the electrode 108 and the surface of the electrode 108 at the side away from the piezoelectric layer 100c are also covered (e.g., completely covered) by the passivation layer 109, the passivation layers 103 and 109 respectively separate the electrodes 102 and 108 from the etching substance (e.g. $XeF_2$), thereby protecting the electrodes 102 and 108 from being corroded or damaged by the etching substance during the etching process, and the performance of the resulted resonator device can thus be improved.

Referring to FIG. 17B and FIG. 17C, the cavity 120 is defined by the dielectric layer 106 and the passivation layer 103, the electrode 102 and the cavity 120 are separated by the passivation layer 103 located therebetween, and therefore, the electrode 102 is not exposed in the cavity 120. The release holes III and the cavity 120 are in spatial communication with each other, and are overlapped with each other in a direction (e.g., direction D2) perpendicular to the main surface of the substrate 200 or the piezoelectric layer 100c.

Figure 18:
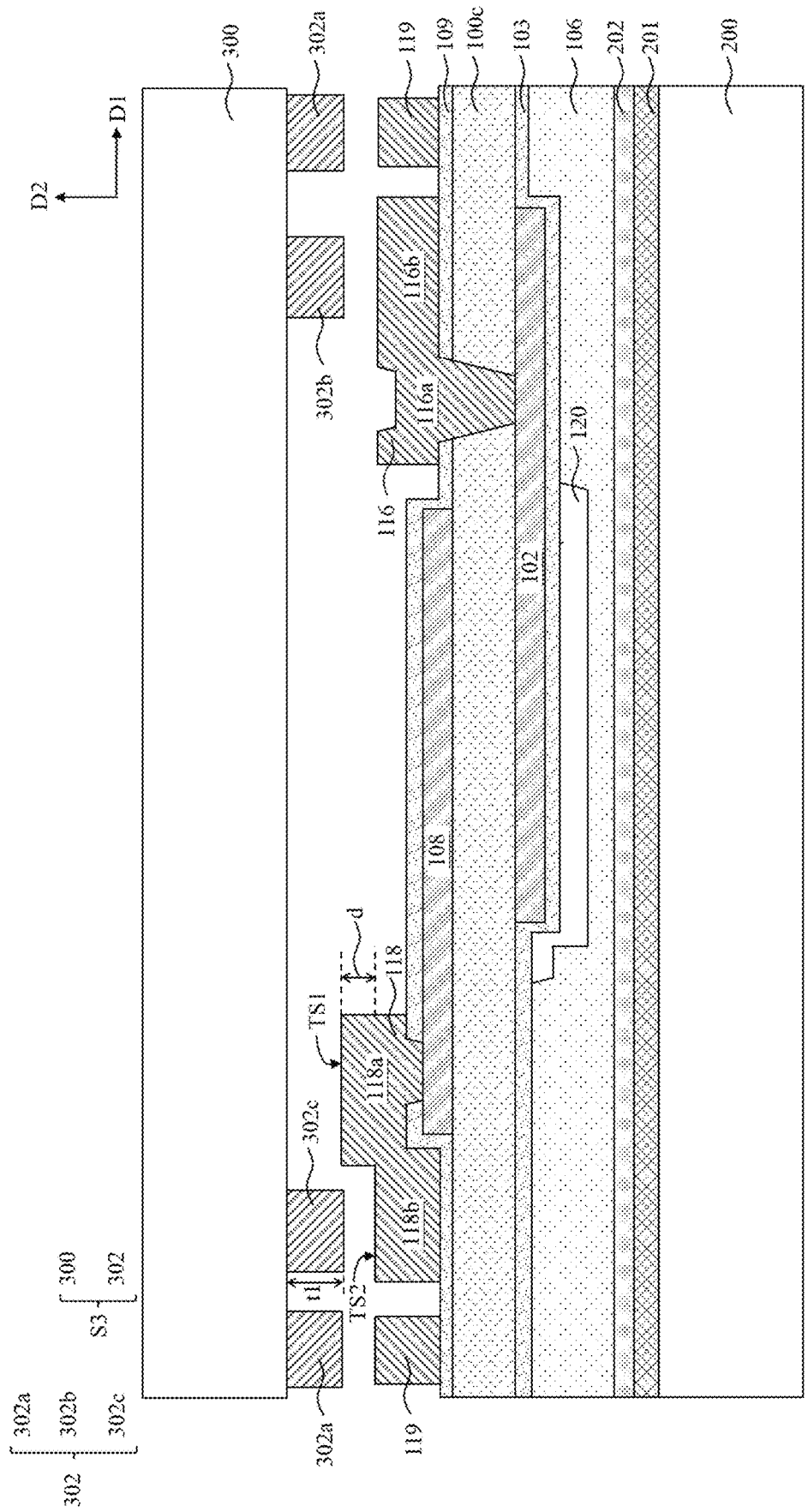

Referring to FIG. 18, a substrate 300 is provided, and a bonding layer 302 is formed on a side of the substrate 300 close to the piezoelectric layer 100c. The substrate 300 and the bonding layer 302 constitute a substrate structure S3, which may also be referred to as a third substrate structure, and the substrate 300 may also be referred to as a third substrate or a second carrier substrate. The material of the substrate 300 may be the same as or different from the material of the substrate 200. For example, the material of the substrate 300 may be or include a semiconductor material, an insulating material, such as high resistance silicon, glass, or the like. The bonding layer 302 is used for bonding to the conductive connectors 116, 118 and the bonding seal ring portion 119, and may include a material similar to, the same as or different from those of the conductive connectors 116, 118 and the bonding seal ring portion 119. For example, the bonding layer 302 may include a metallic material such as aluminum, copper, gold, titanium, tungsten, platinum, the like, alloys thereof, or combinations thereof, and the bonding layer 302 may also be referred to as a bonding metal layer. The forming process of the bonding layer 302 may include a deposition process (e.g., physical vapor deposition) and a patterning process.

In some embodiments, the bonding layer 302 may include a bonding seal ring portion 302a, a bonding connection part 302b, and a bonding connection part 302c. The bonding seal ring portion 302a, the bonding connection part 302b and the bonding connection part 302c are respectively configured to be bonded to the bonding seal ring portion 119, the conductive connector 116, and the conductive connector 118, and are respectively disposed at the positions corresponding to the positions of the bonding seal ring portion 119, the conductive connector 116, and the conductive connector 118 (e.g., at the positions overlapped with the bonding seal ring portion 119, the conductive connector 116, and the conductive connector 118 in the direction D2 perpendicular to the main surface of the substrate 200 or the piezoelectric layer 100c). In some embodiments, the bonding seal ring portion 302a also has a ring-shaped structure corresponding to (similar to or the same as) the shape of the bonding seal ring portion 119, such that the bonding seal ring portion 119 and the bonding seal ring portion 302 can enclose to form a cavity after a subsequent bonding process. The widths of the bonding seal ring portion 302a and the bonding seal ring portion 119 in the direction D1 may be the same or different.

Still referring to FIG. 18, in some embodiments, the conductive connector 118 has a body part 118a and an extension part 118b connected to each other, the body part 118a is directly connected to the electrode 108, and has a conductive via portion extending through the passivation layer 109 to connect to the electrode 108, the body part 118a is located over (e.g., directly over) the electrode 108 and a portion of the passivation layer 109 covering the electrode 108, that is, the body part 118a is overlapped (e.g., at least partially overlapped) with the electrode 108 in the direction D2 perpendicular to the main surface of the substrate 200. The extension part 118b is located on a side of the body part 118a and may be located on a side of the electrode 108 in a direction (e.g., the direction D1) parallel to the main surface of the substrate 200. The extension part 118b is not overlapped with the electrode 108 in a direction (e.g., the direction D2) perpendicular to the main surface of the substrate 200. In some embodiments, the body part 118a and the extension part 118b have substantially the same thickness, since the body part 118a is overlapped with the electrode 108, and the extension part 118b is not overlapped with the electrode 108, the bottom of the body part 118a is located at a level height higher than the bottom of the extension part 118b, and the surface TS1 (i.e., the top surface or topmost surface in the drawing) of the body part 118a at the side away from the piezoelectric layer 100c and the passivation layer 109 is higher than the surface TS2 (i.e., the top surface in the drawing) of the extension part 118b at the side away from the piezoelectric layer 100c and the passivation layer 109. That is to say, the surface TS1 is located at a level height higher than that of the surface TS2. Herein, the thicknesses of the body part and the extension part refer to their thicknesses in a direction (e.g., the direction D2) perpendicular to the main surface of the substrate 200; the "level height" where a surface is located refers to its height relative to the main surface of the substrate 200. That is to say, the height of the surface TS1 relative to the main surface of the substrate 200 (i.e., the vertical distance from the surface TS1 to the main surface of the substrate 200 in a direction perpendicular to the main surface of the substrate 200) is greater than the height of the surface TS2 relative to the main surface of substrate 200 (i.e., the vertical distance from the surface TS2 to the main surface of the substrate 200 in a direction perpendicular to the main surface of substrate 200). In other words, the surfaces TS1 and TS2 of the body part 118a and the extension part 118b of the conductive connector 118 have a height difference d in a direction perpendicular to the substrate 200.

In some embodiments, similar to the conductive connectors 118a and 118b, the conductive connector 116 also has a body part 116a and an extension part 116b connected to each other; the body part 116a is directly connected to the electrode 102 and has a conductive via portion extending through the passivation layer 109, and the piezoelectric layer 100c to connect to electrode 102. The extension part 116b is located on a side of the body part 116a in the horizontal direction (e.g., the direction D1). In some embodiments, the topmost surface of the body part 116a is substantially level with the top surface of the extension part 116b (i.e., the surface at the side away from the piezoelectric layer 100c and the passivation layer 109). In some embodiments, the surface of the extension part 116b of the conductive connector 116 at the side away from the piezoelectric layer 100c, the surface of the extension part 118b of the conductive connector 118 at the side away from the piezoelectric layer 100c, and the surface of the bonding seal ring portion 119 at the side away from the piezoelectric layer 100c and the passivation layer 109 (i.e., the top surfaces of these components in the drawing) are substantially located at the same level height, that is, substantially level with each other, which facilitates subsequent bonding to the carrier substrate.

In some embodiments, the bonding connection parts 302b and 302c on the substrate 300 are disposed at positions corresponding to the extension parts 116b and 118b of the conductive connectors 116 and 118, respectively. The bonding connection parts 302b and 302c and the bonding seal ring portion 302a of the bonding layer 302 have substantially the same thickness t1 in the direction perpendicular to the main surface of the substrate 200 or 300, so as to facilitate bonding. In some embodiments, the thickness t1 of the bonding layer 302 is disposed to be greater than the height difference d between the body part 118a and the extension part 118b of the conductive connector 118. For example, the thickness t1 may be in a range of 0.5 μm to 6 μm, but the present disclosure is not limited thereto.

Figure 19:
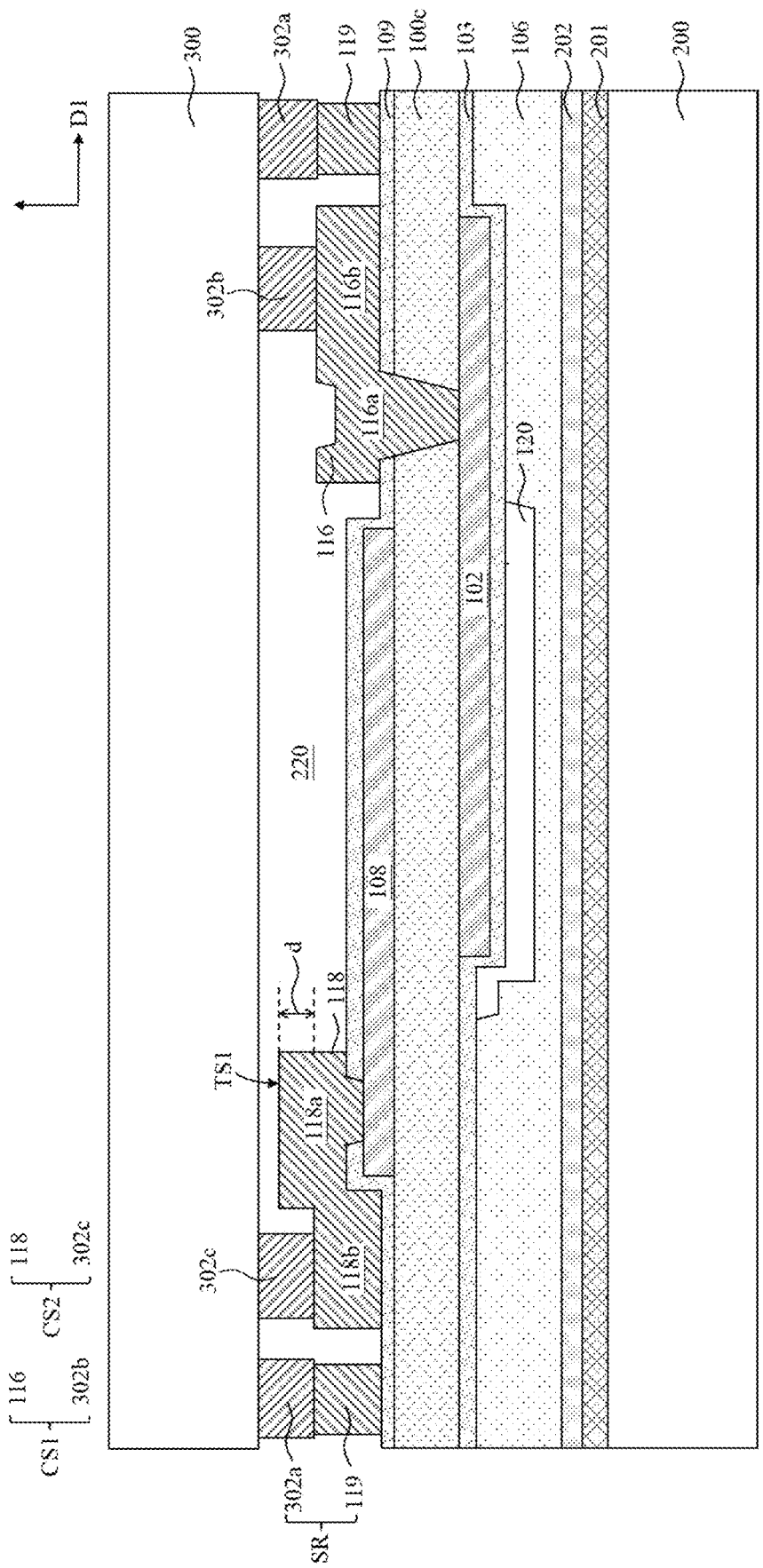

Referring to FIG. 18 and FIG. 19, a bonding process is performed to bond the bonding seal ring portion 302a, the bonding connection part 302b and the bonding connection part 302c of the bonding layer 302 of the substrate structure S3 to the bonding seal ring portion 119, the extension part 116b of conductive connector 116, and the extension part 118b of conductive connector 118, respectively, such that the substrate structure S3 is bonded to the underlying substrate including the substrate 200, the piezoelectric layer 100c and other components. For example, the bonding seal ring portion 302a and the bonding seal ring portion 119, the bonding connection part 302b and the extension part 116b of the conductive connector 116, the bonding connection part 302c and the extension part 118b of the conductive connector 118 each have a metal-to-metal bonding interface therebetween.

Referring to FIG. 19, after the bonding process, the bonding seal ring portion 302a and the bonding seal ring portion 119 are bonded to each other, and are enclosed with the substrate 300 and the passivation layer 109 to form a cavity 220. In some embodiments, the bonding seal ring portion 302a and the bonding seal ring portion 119 are bonded to each other to form a seal ring structure SR; the conductive connector 116 and the bonding connection part 302b are bonded to and electrically connected to each other, so as to constitute a connection structure CS1; the conductive connector 118 and the bonding connection part 302c are bonded to and electrically connected to each other, so as to constitute a connection structure CS2. The seal ring structure SR is spaced apart and electrically isolated from the connection structures CS1 and CS2. The seal ring structure SR is, for example, electrically floating. The cavity 220 is surrounded by the seal ring structure SR, and defined by the inner sidewall of the seal ring structure SR in a direction (e.g., horizontal direction) parallel to the main surface of the substrate 200, and the cavity 220 is located between the substrate 300 and the passivation layer 109, and defined by the facing surfaces of the substrate 300 and the passivation layer 109 that face each other, in the direction (e.g., the vertical direction) perpendicular to the main surface of the substrate 200. At least portions of the connection structures CS1 and CS2 protruding from the surface of the passivation layer 109 at the side away from the piezoelectric layer 100c are located in the cavity 220, that is, at least the portions of the connection structures CS1 and CS3 are located in the region surrounded by the seal ring structure SR in the direction (e.g., the horizontal direction) parallel to the main surface of the substrate 200. In some embodiments, a portion of the body part 118a of the conductive connector 118 that protrudes from the extension part 118b is overlapped with the bonding layer 302 in a horizontal direction (e.g., direction D1), and a gap is existed between the surface TS1 of the body part 118a at the side close to the substrate 300 and the surface of the substrate 300 at the side close to the cavity 220, that is, the surface TS1 of the body part 118a is not in contact with the substrate 200, but the present disclosure is not limited thereto.

Figure 20:
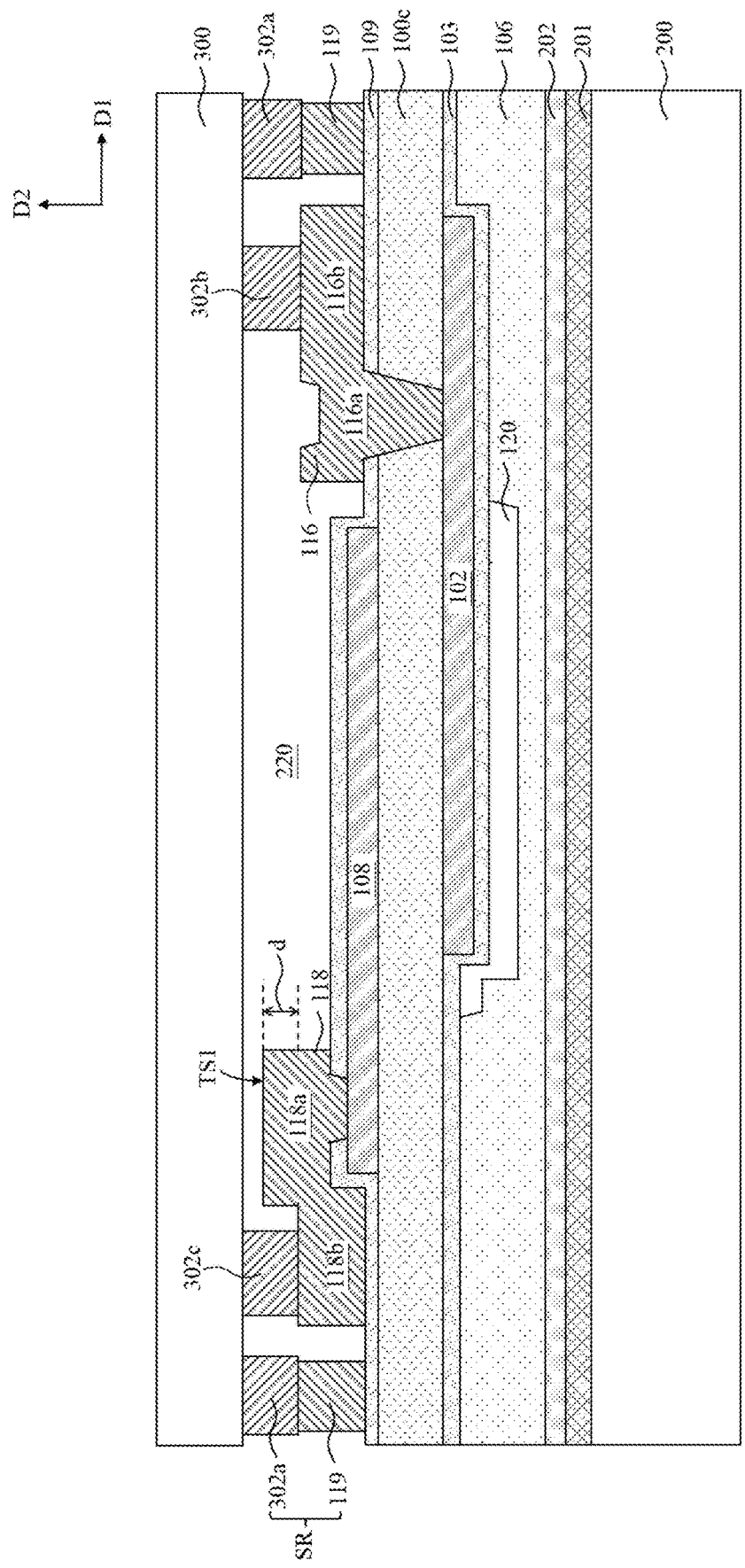

Referring to FIG. 19 to FIG. 20, in some embodiments, a thinning process is performed on the substrate 300, for example, from a side of the substrate 300 away from the cavity 220 and the piezoelectric layer 100c, so as to remove a portion of the substrate 300 and reduce the thickness of the substrate 300 in the direction D2. The thinning processes may include a grinding process such as CMP, an etching process, combinations thereof, or the like.

Figure 21:
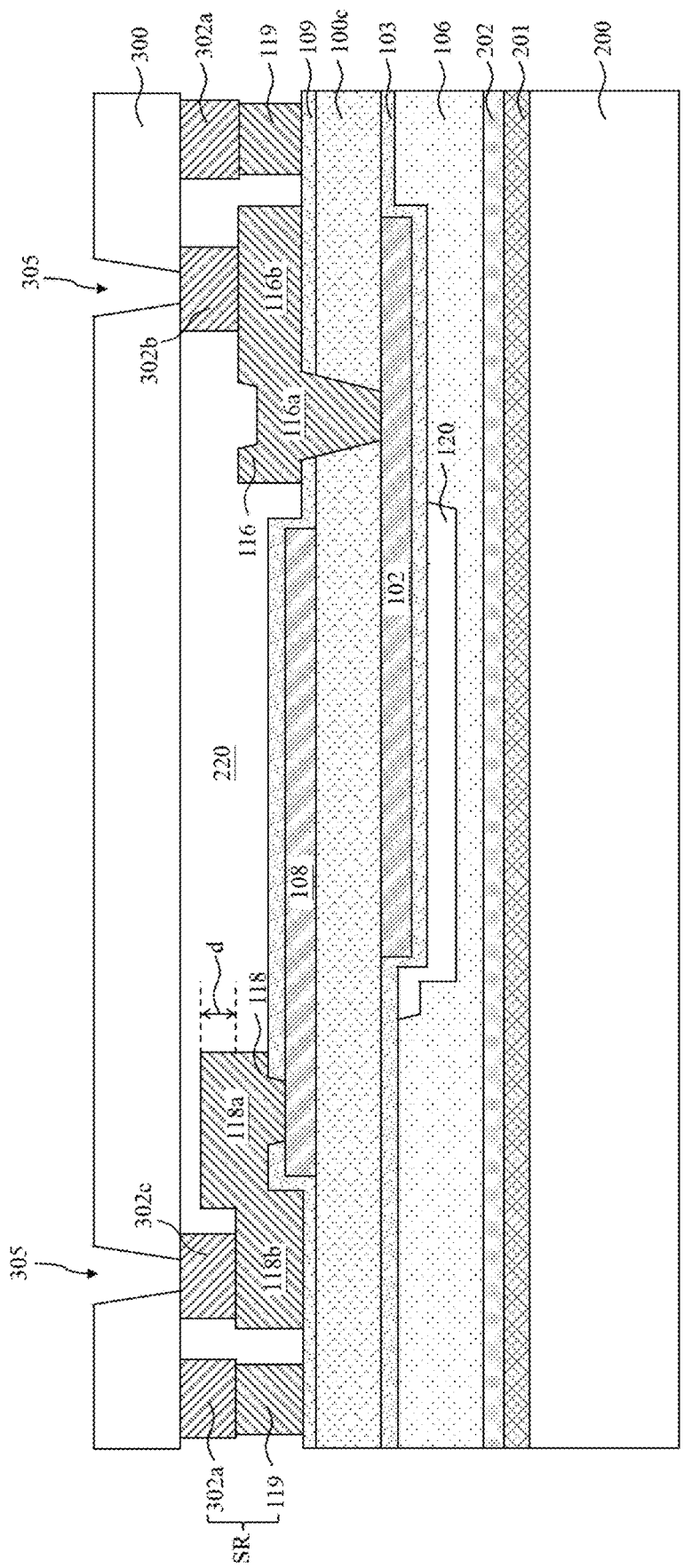

Referring to FIG. 21, thereafter, a patterning process (e.g., including photolithography and etching processes) is performed on the substrate 300 to form via holes 305 in the substrate 300. In some embodiments, a plurality of vias 305 extend through the substrate 300 and respectively expose portions of the surfaces of the bonding connection parts 302b and 302c at the side away from the conductive connectors 116 and 118 and close to the substrate 300, for further electrical connections. In some embodiments, the via holes 305 may also be referred to as through-substrate via holes (TSV).

Figure 22:
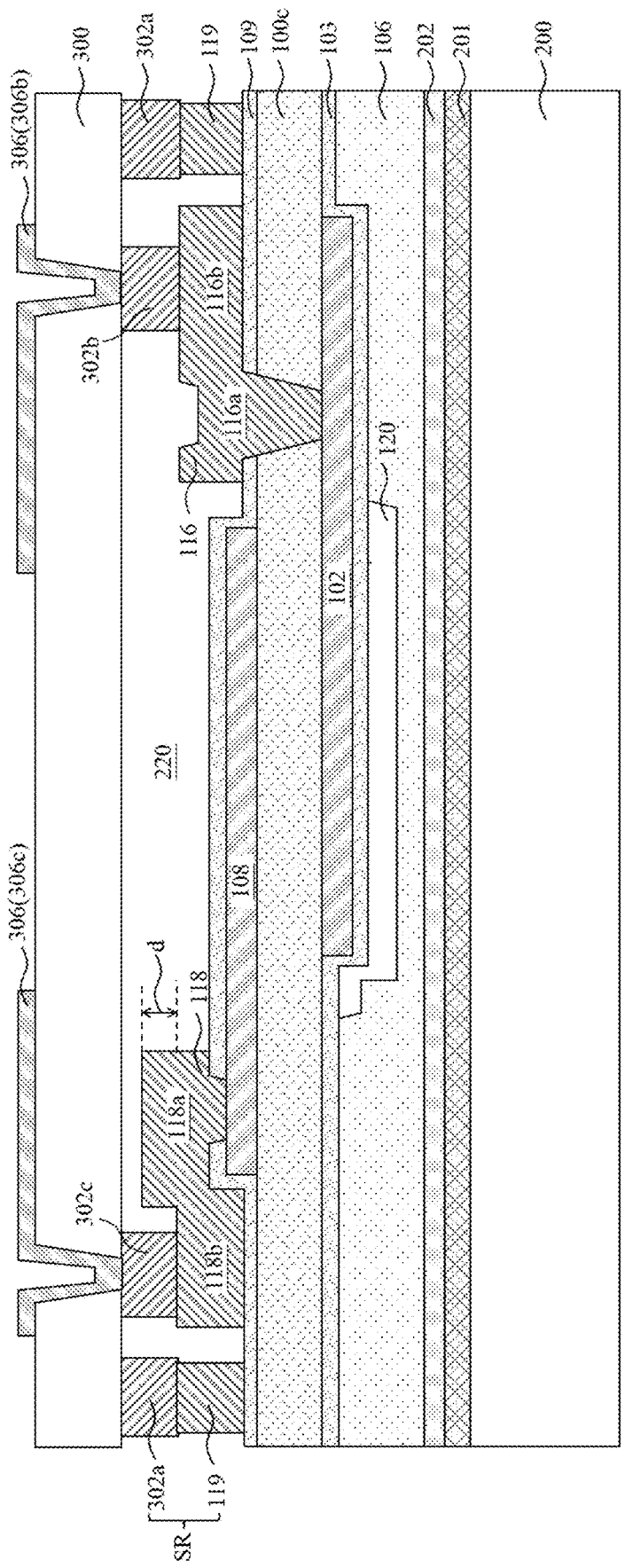

Referring to FIG. 22, a redistribution layer (RDL) 306 is formed on the substrate 306. The redistribution layer 306 extends along the surface of the substrate 300 at the side away from the piezoelectric layer 100c and fills into the via holes 305 to be electrically connected to the bonding connection parts 302b and 302c. The redistribution layer 306 includes a conductive material, and includes, for example, one or more of metallic materials such as aluminum (Al), copper (Cu), gold (Au), titanium (Ti), tungsten (W), platinum (Pt), and the like. The forming method of the redistribution layer 306 may include a deposition process such as physical vapor deposition, an electroplating process and/or a patterning process. In some embodiments, the redistribution layer 306 includes conductive lines 306b and 306c respectively connected to bonding connection parts 302b and 302c. The conductive line 306b extends through the substrate 300 to be electrically connected to the bonding connection part 302b; the conductive line 306c extends through the substrate 300 to be electrically connected to the bonding connection part 302c. In some embodiments, the conductive line 306b and the conductive line 306c are isolated (e.g., physically and electrically isolated) from each other. In some embodiments, the conductive lines 306b and 306c are partially filled in the via holes 305, for example, the conductive lines 306b and 306c respectively line the surfaces of the via holes 305 without filling up the via holes 305. However, the present disclosure is not limited thereto. In alternative embodiments, the conductive lines 306b and 306c may further substantially fill up the via holes 305.

Figure 23:
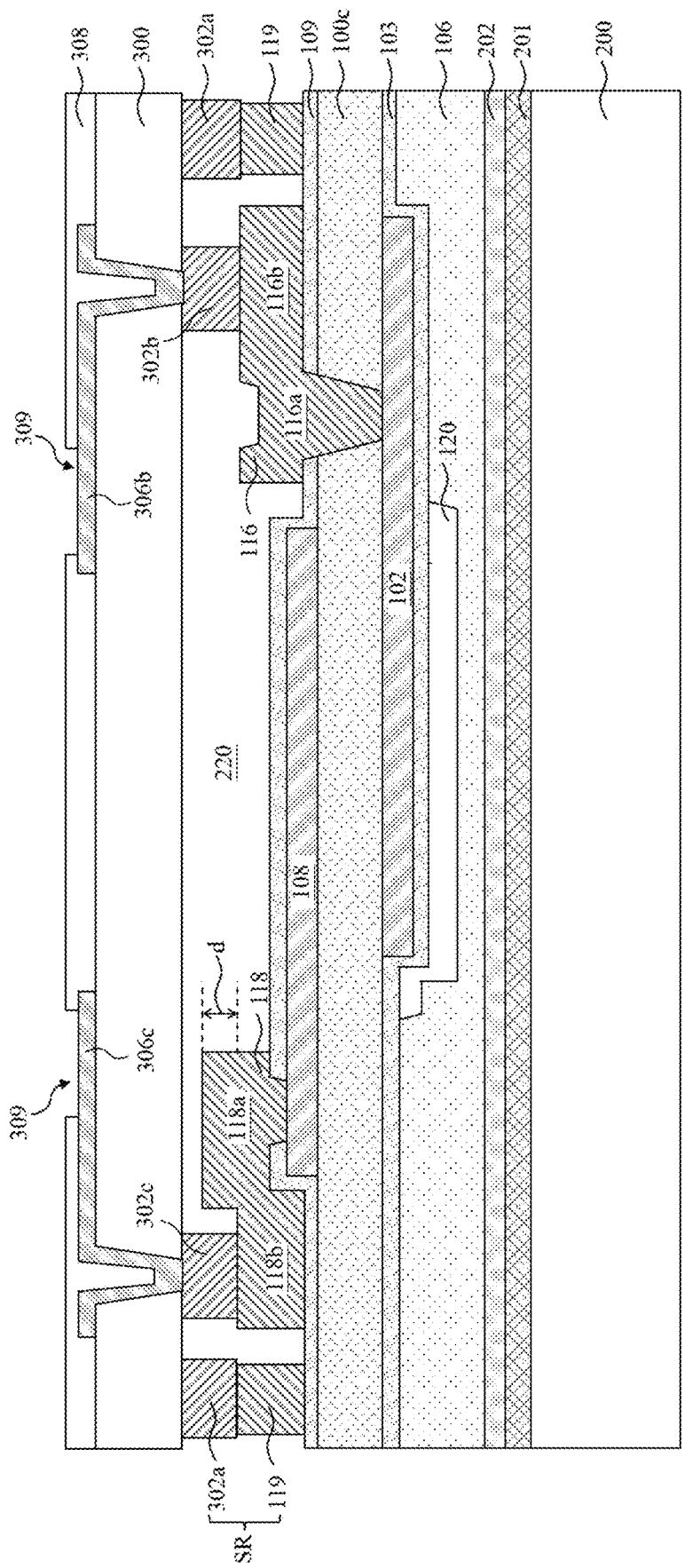

Referring to FIG. 23, a passivation layer 308 is formed on a side of the substrate 300 away from the cavity 220, so as to cover the surfaces of the substrate 300 and the redistribution layer 306 at the side away from the cavity 200, and the passivation layer 308 may fill into the via holes 305 of substrate 300 to fill the spaces of the via holes 305 that are not filled by the redistribution layer 306. The passivation layer 308 has a plurality of openings 309 to respectively expose portions of the surfaces of the conductive lines 306b and 306c of the redistribution layer 306 at the side away from the substrate 300. The passivation layer 308 may include a dielectric material, such as an organic dielectric material, an inorganic dielectric material, or a combination thereof. For example, the material of the passivation layer 308 may include silicon oxide, silicon nitride, tetraethyl orthosilicate (TEOS), a polymer material (e.g., polyimide (Pi)), the like or combinations thereof. In some embodiments, the forming method of the passivation layer 308 may include forming a passivation material layer by a deposition process such as chemical vapor deposition, and then performing a patterning process on the passivation material layer to form the plurality of openings 309.

Figure 24A:
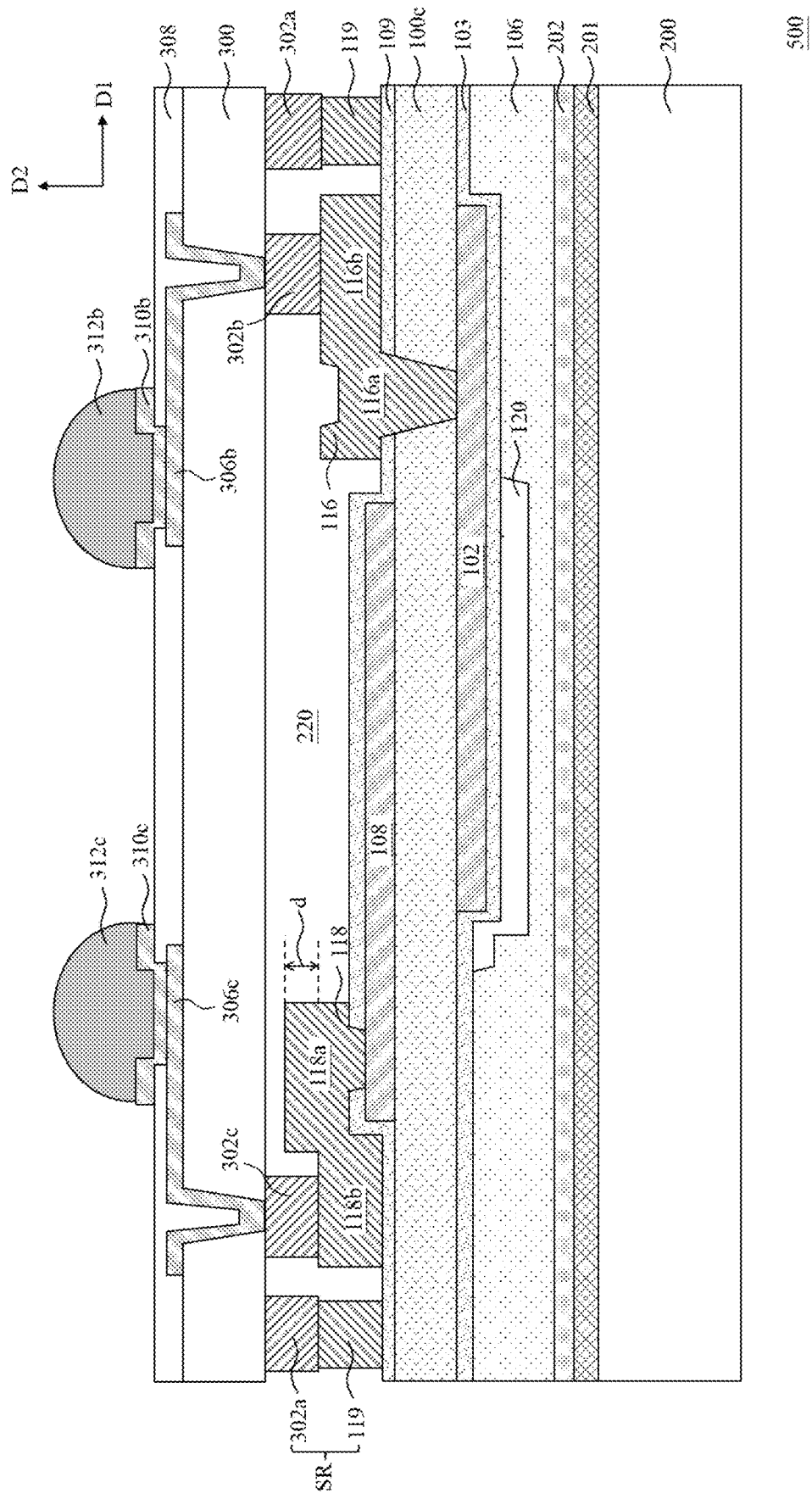
Figure 24B:
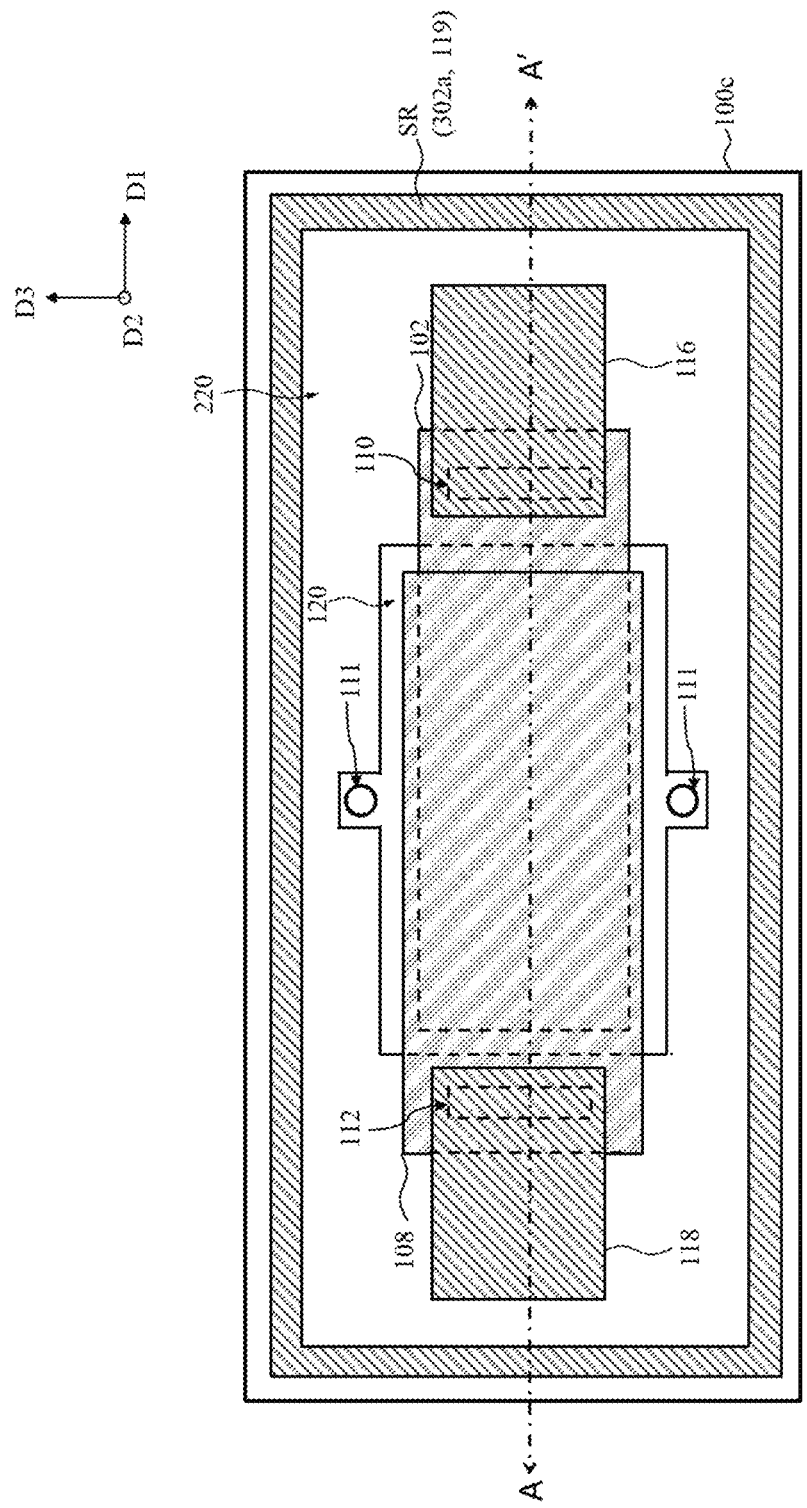

Referring to FIG. 23, FIG. 24A and FIG. 24B, thereafter, conductive layers 310b and 310c are formed on the passivation layer 308, and respectively fill into the openings 309 of the passivation layer 308 to be electrically connected to the conductive lines 306b and 306c. In some embodiments, the conductive layers 310b and 310c are under bump metallurgy (UBM) layers, which are used for subsequent bump forming processes (e.g., bumping process). The materials of the conductive layers 310b and 310c include, for example, conductive materials such as copper, tin, tin-silver alloy, and the conductive layers 310b and 310c may be formed by a suitable process such as physical vapor deposition, electroplating, or the like.

Thereafter, conductive bumps 312b and 312c are formed on the conductive layers 310b and 310c, respectively. In some embodiments, the conductive bumps 312b and 312c are solder bumps, which may also be referred to as solder balls. The conductive bumps 312b and 312c may be formed on the conductive layers 310b and 310c, for example, by a bumping process, so as to be electrically connected to the conductive layers 310b and 310c, respectively; the conductive bump 312b is electrically connected to the electrode 102 through the conductive layer 310b, the conductive line 306b of the redistribution layer, and the connection structure CS1 including the bonding connection part 302b and the conductive connector 116; the conductive connector 312c is electrically connected to the electrode 108 through the conductive layer 310c, the conductive line 306c of the redistribution layer, and the connection structure CS2 including the bonding connection part 302c and the conductive connector 118.

Referring to FIG. 24A, as such, the bulk acoustic wave resonator 500 is thus formed. In some embodiments, the bulk acoustic wave resonator 500 includes the substrate 200, the barrier layer 201, the buffer layer 202, the dielectric layer 106, the piezoelectric layer 100c, the electrodes 102 and 108, the passivation layers 103 and 109, the conductive connectors 116 and 118, the bonding connection parts 302b and 302c, the seal ring structure SR, the substrate 300, the redistribution layer 306, the passivation layer 308, the conductive layers 310b and 310c, the conductive bumps 312b and 312c, and the cavities 120 and 220.

The barrier layer 201 is disposed on the surface of the substrate 200 at the side close to the piezoelectric layer 100c, and covers the main surface of the substrate 200, and the buffer layer 202 is disposed on the surface of the barrier layer 201 at the side away from the substrate 200 and close to the piezoelectric layer 100c. The barrier layer 201 is configured to prevent undesired conductive channel from being formed due to charge accumulation on the surface of the substrate 200. The buffer layer 202 is located between the barrier layer 201 and the dielectric layer 106, and is configured to provide a better bonding condition, such that the buffer layer 202 and the dielectric layer 106 have a high quality bonding interface.

The piezoelectric layer 100c is disposed on the side of the dielectric layer 106 away from the buffer layer 202, the barrier layer 201 and the substrate 200, and has a first side and a second side opposite to each other in a direction (e.g., direction D2) perpendicular to the main surface of the substrate 200. For example, the substrate 200, the barrier layer 201, the buffer layer 202 and the dielectric layer 106 are located on the first side of the piezoelectric layer 100c; the substrate 300, the seal ring structure SR, the connection structures CS1 and CS2 and the conductive bumps 312b and 312c and other components are disposed on the second side of the piezoelectric layer 100c.

The electrodes 102 and 108 are located on opposite sides of the piezoelectric layer 100c in a direction (e.g., direction D2) perpendicular to the main surface of substrate 200, and the respective sidewalls of the electrodes 102 and 108 and the surfaces of the electrodes 102 and 108 at the sides away from the piezoelectric layer 100c are respectively covered (e.g., completely covered) by the passivation layers 103 and 109. For example, the electrode 102 and the passivation layer 103 are disposed on the side (i.e., the first side) of the piezoelectric layer 100c close to the substrate 200, and are disposed between the piezoelectric layer 100c and the dielectric layer 106, the cavity 120 is located on the first side of the piezoelectric layer 100c and defined between the passivation layer 103 and the dielectric layer 106, and a portion of the passivation layer 103 is located between the cavity 120 and the electrode 102 and separates the cavity 120 and the electrode 102 apart from each other, that is, the electrode 102 has no surface exposed in the cavity 120; the electrode 108 and the passivation layer 109 are disposed on a side (i.e., the second side) of the piezoelectric layer 100 close to the substrate 300, and the cavity 220 is disposed on the second side of the piezoelectric layer 100c, and defined by the passivation layer 109, the substrate 300, and the seal ring structure SR between the passivation layer 109 and the substrate 300, the cavity 220 and the electrode 108 are separated apart from each other by the passivation layer 109 and the conductive connector 118 therebetween, such that the electrode 108 has no surface exposed to cavity 220.

FIG. 24B is atop view illustrating a bulk acoustic wave resonator 500 according to some embodiments of the present disclosure. FIG. 24A is a cross-sectional view taken along the line A-A' of FIG. 24B. It should be understood that, for the sake of brevity and clarity, FIG. 24B does not illustrate all the components in FIG. 24A.

Referring to FIG. 24A and FIG. 24B, in some embodiments, the piezoelectric layer 100c, the electrode 102 and the cavity 120 located on the first side of the piezoelectric layer 100c, and the electrode 108 and the cavity 2220 located on the second side of the piezoelectric layer 100c are overlapped (e.g., at least partially overlapped) with each other in a direction (e.g., the direction D2) perpendicular to the main surface of the substrate 200 or the piezoelectric layer 100c. The cavity 120 and the cavity 220 are resonant cavities and may be respectively referred to as a first cavity and a second cavity, or vice versa. In some embodiments, as shown in FIG. 24B, the electrode 102 and the electrode 108 laterally protrude from the cavity 120 along opposite directions in a direction (e.g., the direction D1) parallel with the main surface of the substrate 200, that is, the electrode 102 and the electrode 108 extend beyond the sidewalls or edges of the cavity 120 that are extending along the direction D3 and opposite to each other in the direction D1. The portions of the electrodes 102 and 108 extending beyond the edges of the cavity 120 include their respective electrode lead-out parts, and the conductive connectors 116 and 118 respectively pass through the via holes 110 and 112 to land on the electrode lead-out parts of the electrodes 116 and 118. In some embodiments, the cavity 120 laterally protrudes from the electrodes 102 and 108 in a direction D3 that is parallel to the main surface of substrate 200 and intersects (e.g., perpendicular to) the direction D1, that is, the cavity 120 extends beyond the respective sidewalls or edges of electrodes 102 and 108 that are opposite to each other in the direction D3 and extending in the direction D1. For example, the cavity 120 includes a first extension part and a second extension part that extend beyond opposite sidewalls of the electrodes 102 and 108 toward opposite directions along the direction D3, and the first extension part and the second extension part respectively have a first protruding part and a second protruding part that protrude toward edges of the resonator in the direction D3, the first protruding part and the second protruding part are in spatial communication and overlapped with the release holes 11 in the direction D2.

The cavity 220 is defined in a region surrounded by the seal ring structure SR. In some embodiments, orthographic projections of the electrodes 102 and 108, the cavity 120, the conductive connectors 116 and 118, and the bonding connection parts 302b and 302c on the main surface of the substrate 200 or the piezoelectric layer 100c (e.g., the surface of the piezoelectric layer 100c at the side close to the electrode 102 or 108) in a direction (e.g., the direction D2) perpendicular to main surface of the substrate 200 or the piezoelectric layer 100c is located within a region surrounded by the corresponding orthographic projection of the seal ring structure SR on the main surface of the substrate 200 or the piezoelectric layer 100c (e.g., the surface of the piezoelectric layer 100c at a side close to the electrode 102 or 108) in the direction perpendicular to the main surface of the substrate 200 or the piezoelectric layer 100c.

FIG. 25 to FIG. 29 illustrate some of the forming steps in a method of manufacturing a bulk acoustic wave resonator according to some other embodiments of the present disclosure. The forming method of the present embodiment is similar to that of the foregoing embodiment, except that the forming method of the piezoelectric layer in this embodiment is different. Differences will be described in detail below, and similarities with the above-described embodiments will not be repeated. It should be noted that, the same or similar reference numerals are used to represent the same or similar elements in various embodiments, and the elements represented by the same or similar reference numerals in the respective embodiments use the same or similar candidate materials, and the related materials are not repeatedly described in each embodiment, but may be referred to previously described embodiments.

Figure 25:
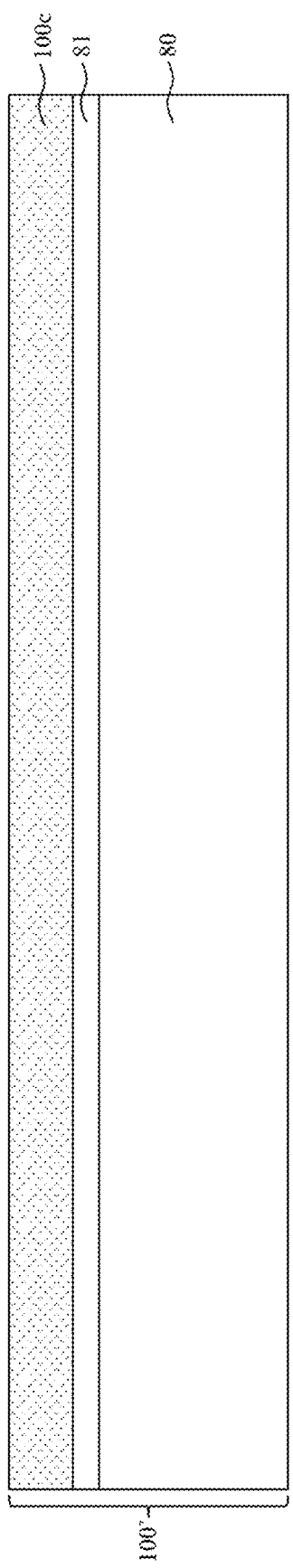
FIG. 25 to FIG. 30 are schematic cross-sectional views illustrating some process steps in a method of manufacturing a bulk acoustic wave resonator according to some other embodiments of the present disclosure.

Referring to FIG. 25, in some embodiments, a substrate structure 100' is provided. The substrate structure 100' is a piezoelectric substrate structure including a piezoelectric layer 100c. In some embodiments, the substrate structure 100' is a piezoelectric-on-insulator (POI) substrate, such as a PO wafer. The substrate structure 100' includes a substrate 80, an insulating layer 81 and a piezoelectric layer 100c from bottom to top. For example, the substrate 80 is a semiconductor substrate, such as a silicon substrate or a silicon-containing substrate, or may include other suitable semiconductor materials. The insulating layer 81 includes an insulating material such as silicon oxide ($SiO_2$), and the insulating layer 81 may be a single-layer structure or a multi-layer structure. The material of the piezoelectric layer 100c is similar to or the same as the material of the piezoelectric layer 100c described in the foregoing embodiment, and may include lithium niobate or lithium tantalate. In some embodiments, the substrate structure 100' may also be referred to as a first substrate structure, and the piezoelectric layer 100c may be referred to as a first portion of the first substrate structure, the substrate 80 and the insulating layer 81 may be referred to as a second portion of the first substrate structure.

In some embodiments, the method of forming the substrate structure 100' includes the following steps: a substrate 80 and a piezoelectric substrate (not shown) are provided, the substrate 80 and the piezoelectric substrate are respectively formed by crystal pulling processes, for example; thereafter, insulating layers (or referred to as bonding insulating layers or bonding dielectric layers) are respectively formed on the surfaces of the substrate 80 and the piezoelectric substrate, the insulating layer on the substrate 80 and the insulating layer on the piezoelectric substrate may be bonded together by a fusion bonding process, so as to form an insulating layer (or referred to as a bonding layer) 81, such that the substrate 80 and the piezoelectric substrate are bonded together through the insulating layer 81 therebetween; in some embodiments, a grinding process (e.g., CMP) may be performed from a side of the piezoelectric substrate away from the substrate 80 to remove a portion of the piezoelectric substrate, and form a piezoelectric layer 100c having a required thickness. In some other embodiments, a portion of the piezoelectric substrate may be removed by defining a cleavage plane in the piezoelectric substrate and then splitting the piezoelectric substrate along the cleavage plane, thereby remaining the piezoelectric layer 100c. The split process is similar to the split process in the previous embodiment. For example, hydrogen or helium ions are implanted in the piezoelectric substrate by an ion implantation process before the piezoelectric substrate is bonded to the substrate 80, so as to define a cleavage plane in the piezoelectric substrate, and after the piezoelectric substrate is bonded to the substrate 80, an annealing process is performed on the piezoelectric substrate to split the piezoelectric substrate along the cleavage plane and remove the portion of the piezoelectric substrate. In some embodiments, after the split process, a planarization process may be further performed on the remaining portion of the piezoelectric substrate, such that the resulted piezoelectric layer 100c has a flat top surface and is substantially free of cleavage ions. In some embodiments, the above process steps of removing the portion of the piezoelectric substrate may also be referred to as a thinning process of the piezoelectric substrate.

Figure 26:
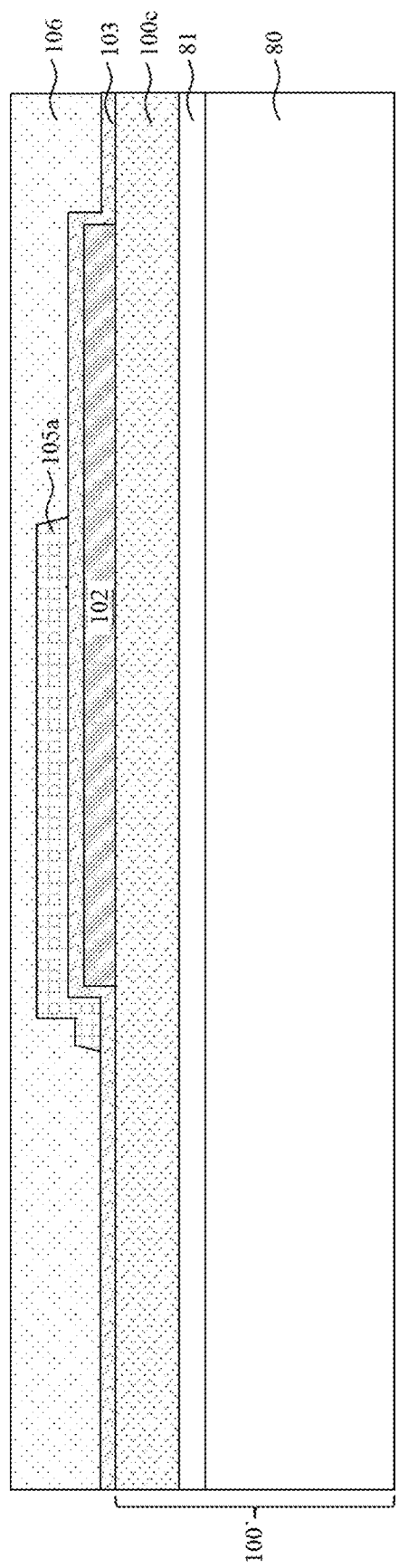

Referring to FIG. 26, the process steps described above with reference to FIG. 1 to FIG. 7 are then performed, so as to form an electrode 102, a passivation layer 103, a sacrificial layer 105 and a dielectric layer 106 on the substrate structure 100'. The above process steps are similar to those described in the foregoing embodiments, which are not described again here.

Figure 27:
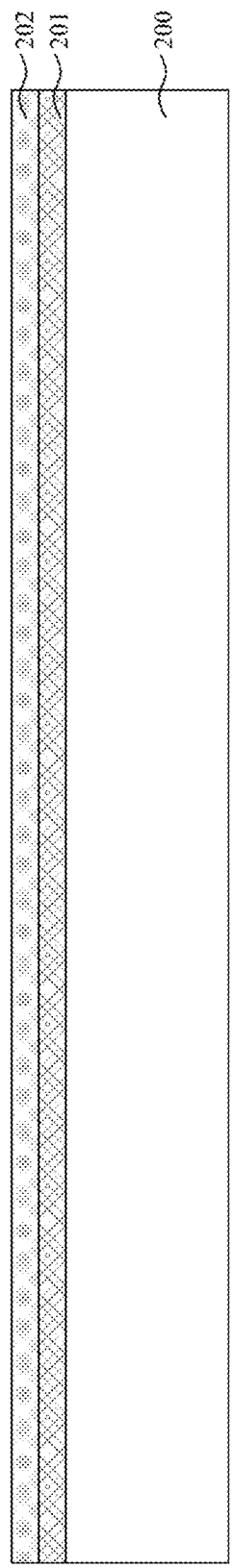

Referring to FIG. 27, similar to the process described above with reference to FIG. 8, a substrate 200 is provided, and a barrier layer 201 and a buffer layer 202 are sequentially formed on the substrate 200.

Figure 28:
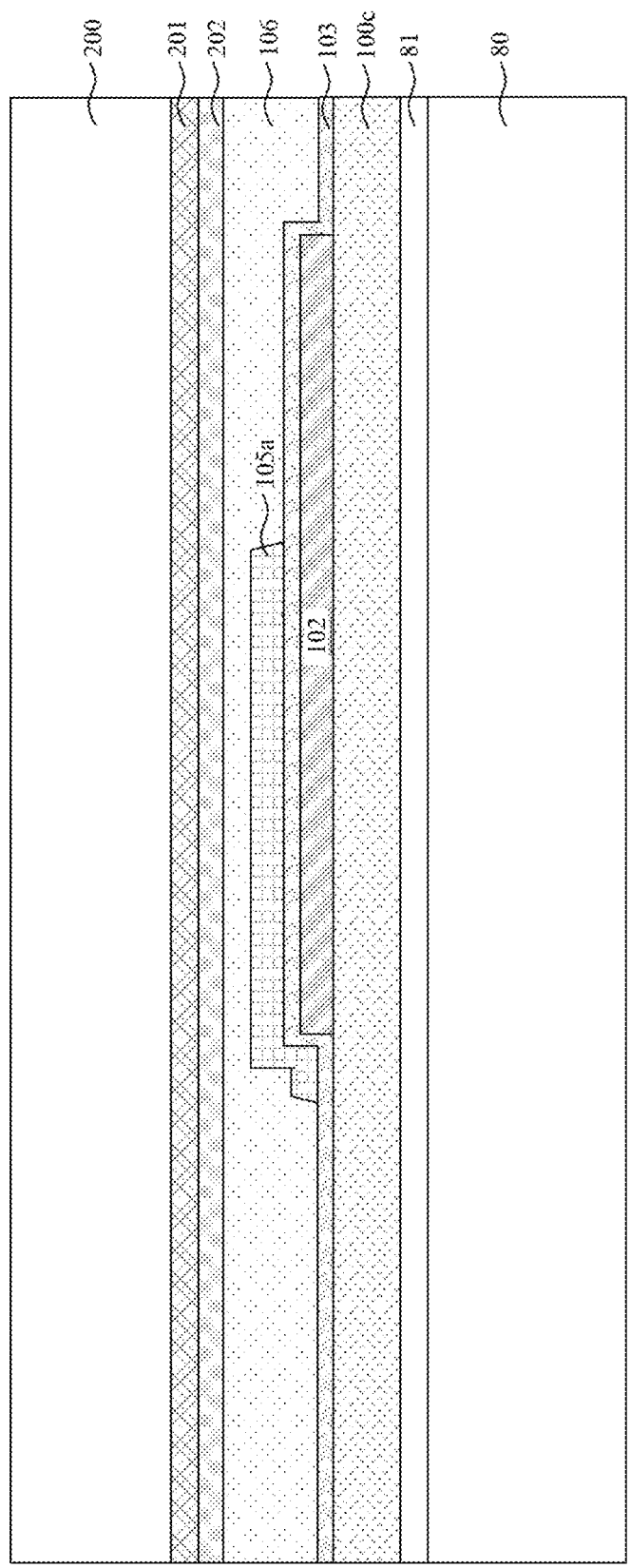

Referring to FIG. 28, a process similar to that of FIG. 9 is performed to bond the buffer layer 202 on the substrate 200 to the dielectric layer 106, such that the structure of FIG. 27 and the structure of FIG. 26 are bonded together.

Figure 29:
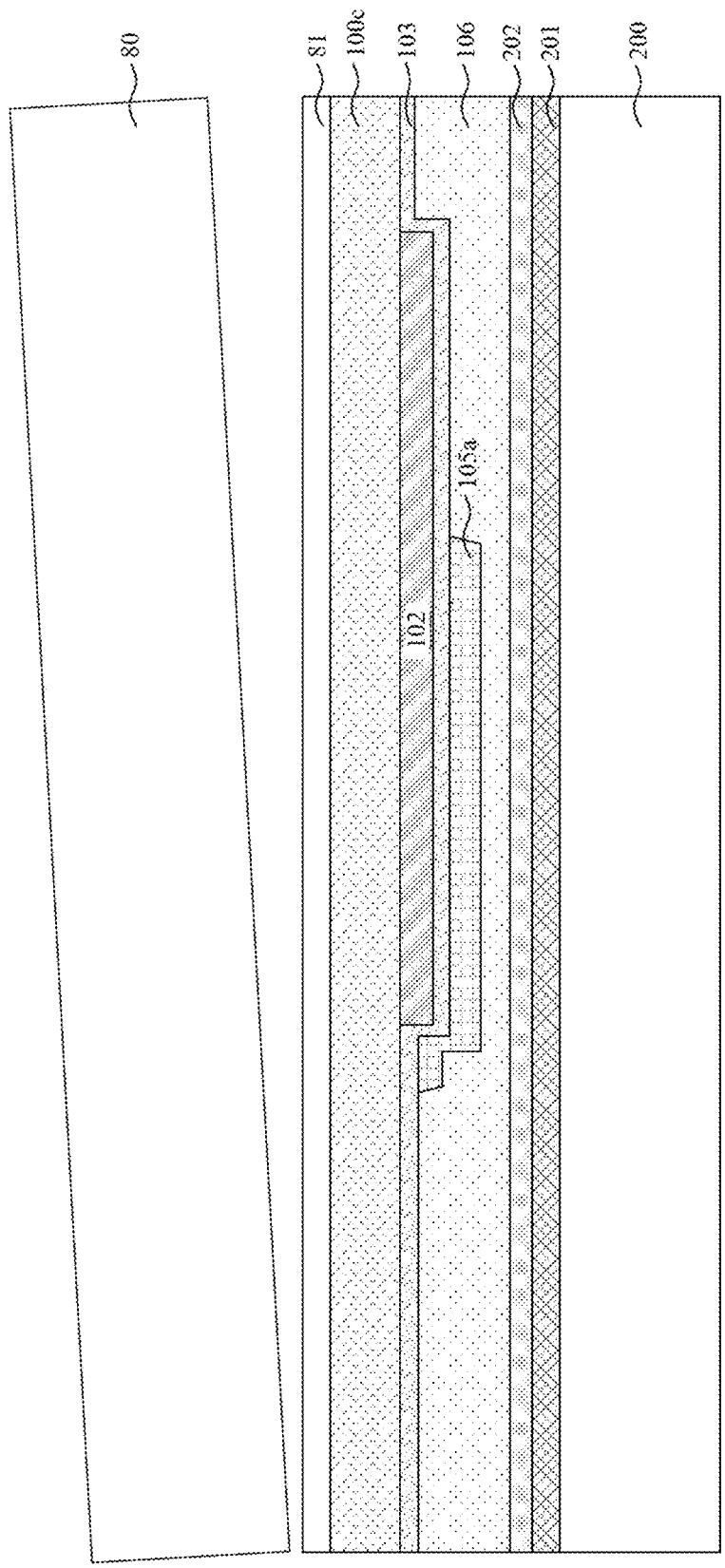

Referring to FIG. 28 to FIG. 29, the structure shown in FIG. 28 is turned over, and the substrate 80 is removed to expose the insulating layer 81. In some embodiments, the substrate 80 may be removed by a grinding process, such as CMP, and the insulating layer 81 may serve as a stop layer of the grinding process.

Figure 30:
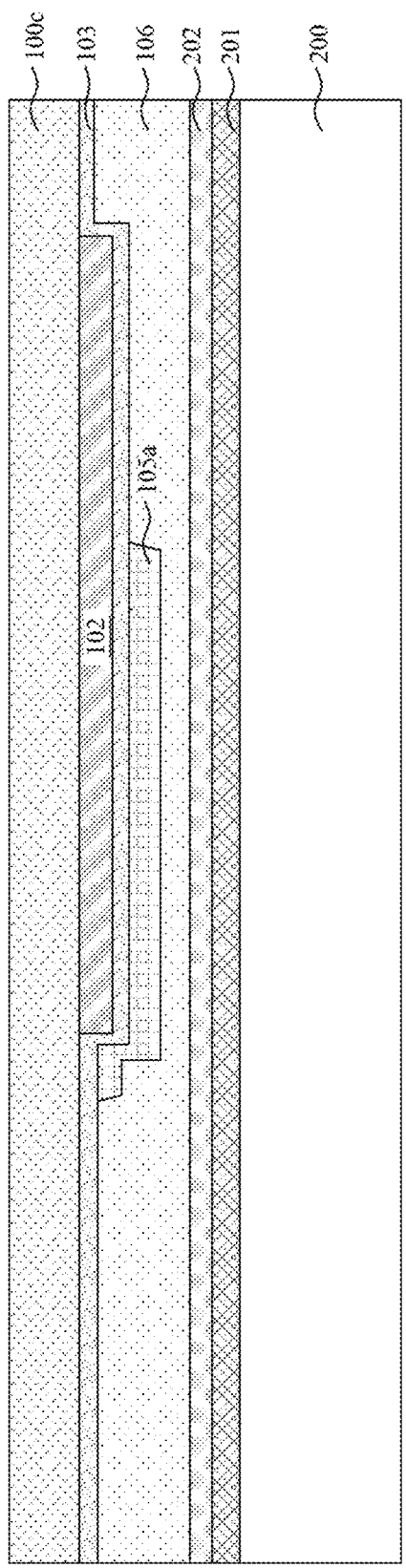

Referring to FIG. 29 to FIG. 30, the insulating layer 81 is then removed to expose the side of the piezoelectric layer 100c away from the substrate 200. In some embodiments, the insulating layer 81 may be removed by a grinding process (e.g., CMP) and/or an etching process. After the insulating layer 81 is removed and the piezoelectric layer 100c is exposed, a thickness measurement of the piezoelectric layer 100c may be optionally performed to ensure that the piezoelectric layer 100c has a desired thickness. In some embodiments, an ion beam etching and/or an ion beam milling process may be further performed on the piezoelectric layer 100c to remove a portion of the piezoelectric layer 100c, such that the thickness of the piezoelectric layer can precisely achieve the required thickness of the piezoelectric layer, and can be more uniform.

The processes similar to those previously described with reference to FIG. 11 to FIG. 24A and FIG. 24B may then be performed, so as to form the bulk acoustic wave resonator 500.

In the embodiments of the present disclosure, instead of using a conventional deposition method to form the piezoelectric layer of the resonator, the piezoelectric layer of the resonator is formed using a piezoelectric substrate, therefore, a piezoelectric substrate made of lithium niobate crystal or lithium tantalate crystal having good piezoelectric properties can be used to form the piezoelectric layer of the bulk acoustic wave resonator; compared to a traditional resonator with aluminum nitride material severing as the piezoelectric layer, the piezoelectric layer formed from lithium niobate crystal or lithium tantalate crystal has a better piezoelectric performance and higher electromechanical coupling coefficient, which can improve the bandwidth and performance of the resonator, thereby improving the performance of the filter formed of the resonator; furthermore, lithium niobate crystal or lithium tantalate crystal has a much higher dielectric constant than aluminum nitride material. In terms of resonators of the same impedance, the area of the resonator using lithium niobate crystal or lithium tantalate crystal with higher dielectric constant as the piezoelectric layer can be significantly smaller than the area of the resonator using aluminum nitride as the piezoelectric layer, that is, the resonator of the embodiments of the present disclosure can significantly reduce the area of the resonator and the filter chip formed thereof, such that the manufacturing cost per unit can be reduced.

In addition, in the embodiments of the present disclosure, through disposing the barrier layer and the buffer layer, undesired conductive channel can be avoided from being formed due to charge accumulation on the surface of the carrier substrate, and the substrate structure can have a good bonding interface condition. Further, the electrodes on the opposite sides of the piezoelectric layer are respectively covered by the passivation layers and are not exposed in the cavity. In such a configuration, the passivation layers can protect the electrodes from being damaged by the etching process during the formation of the cavities, thereby improving the performance of the bulk acoustic wave resonator. On the other hand, in some embodiments, the second cavity on the second side of the piezoelectric layer is defined by a seal ring structure, which is formed by a first bonding seal ring portion and a second bonding seal ring portion bonded to each other, the first bonding seal ring portion is formed over the piezoelectric layer, and the second bonding seal ring portion is formed on a side of the substrate close to the piezoelectric layer. The first bonding seal ring portion and the conductive connectors can be formed in the same manufacturing process, and the second bonding seal ring portion and the bonding connection parts can be formed in a same manufacturing process. This forming method of the second cavity can simplify the manufacturing process and reduce the manufacturing cost.

The following statements should be noted: (1) The accompanying drawings related to the embodiments of the present disclosure involve only the structures in connection with the embodiments of the present disclosure, and other structures can be referred to common designs; (2) In case of no conflict, features in one embodiment or in different embodiments of the present disclosure can be combined.

The foregoing is only the preferred embodiments of the present disclosure and not intended to limit the scope of protection of the present disclosure. Any change or replacement that may be easily thought of by those skilled in the art within the technical scope disclosed by the present invention shall fall within the scope of protection of the present invention. Therefore, the scope of protection of the present invention shall be defined by the appended claims.

The invention claimed is:

1. A method for manufacturing a bulk acoustic wave resonator, comprising:
   providing a first substrate structure comprising a first portion comprising a piezoelectric material configured for forming a piezoelectric layer of the bulk acoustic wave resonator and a second portion serving as a sacrificial substrate, wherein the first portion is located on the second portion;
   forming a first electrode and a first passivation layer on a side of the first portion of the first substrate structure away from the second portion, wherein the first passivation layer covers sidewalls of the first electrode and a surface of the first electrode at a side away from the first substrate structure;
   forming a sacrificial layer and a dielectric layer on the first passivation layer, wherein the sacrificial layer covers a portion of the first passivation layer and is partially overlapped with the first electrode in a direction perpendicular to a main surface of the first substrate structure, and the dielectric layer covers the first passivation layer and the sacrificial layer;
   providing a second substrate structure comprising a second substrate and a barrier layer and a buffer layer sequentially formed on a main surface of the second substrate, wherein the main surface of the second substrate is cleaned to completely remove oxides from the main surface before the forming of the barrier layer, and the barrier layer comprises a non-electron-rich, non-conductive, and non-silicon-oxide layer formed on the main surface of the second substrate to prevent an undesired conductive channel from being generated on the main surface of the second substrate due to charge accumulation on the main surface of the second substrate, and the buffer layer facilitates a bonding strength of the second substrate structure;
   performing a bonding process to bond the buffer layer of the second substrate structure to the dielectric layer on the first substrate structure;
   removing the second portion of the first substrate structure after the bonding process, and leaving the first portion to form the piezoelectric layer;
   forming a second electrode and a second passivation layer on a side of the piezoelectric layer away from the first electrode, wherein the second passivation layer covers sidewalls of the second electrode and a surface of the second electrode at a side away from the piezoelectric layer;
   performing an etching process to remove the sacrificial layer and form a first cavity between the first passivation layer and the dielectric layer, wherein the first passivation layer and the second passivation layer protect the first electrode and the second electrode during the etching process; and
   forming a first conductive connector and a second conductive connector respectively connected to the first electrode and the second electrode.

2. The method of manufacturing the bulk acoustic wave resonator according to claim 1, wherein the first substrate structure is a piezoelectric substrate, and removing the second portion of the first substrate structure comprises:
   before forming the first electrode and the first passivation layer, performing an ion implantation process on the piezoelectric substrate to define a cleavage plane in the piezoelectric substrate, such that the piezoelectric substrate comprises the first portion and the second portion on opposite sides of the cleavage plane; and
   after bonding the second substrate structure, performing an annealing process on the piezoelectric substrate, such that the piezoelectric substrate is split along the cleavage plane, and the second portion of the piezoelectric substrate is removed.

3. The method of manufacturing the bulk acoustic wave resonator according to claim 2, further comprising:
   after removing the second portion of the piezoelectric substrate, performing a planarization process on the first portion.

4. The method of manufacturing the bulk acoustic wave resonator according to claim 1, wherein the first portion of the first substrate structure is a piezoelectric material layer, and the second portion of the first substrate structure comprises a first substrate and an insulating layer, the insulating layer is formed between the first substrate and the piezoelectric material layer, wherein removing the second portion of the first substrate structure comprises:
   removing the first substrate by at least one of a grinding process and an etching process, so as to expose a side of the insulating layer away from the piezoelectric material layer; and
   removing the insulating layer by at least one of a grinding process and an etching process.

5. The method of manufacturing the bulk acoustic wave resonator according to claim 1, wherein the second substrate is a semiconductor substrate, and at least a surface layer of the barrier layer in contact with the semiconductor substrate is the non-conductive, and non-silicon-oxide layer.

6. The method of manufacturing the bulk acoustic wave resonator according to claim 5, wherein a material of the second substrate comprises monocrystalline silicon, and a material of the barrier layer comprises at least one selected from the group consisting of polysilicon, amorphous silicon, silicon nitride, silicon carbide, aluminum nitride, and gallium nitride.

7. The method of manufacturing the bulk acoustic wave resonator according to claim 1, wherein a material of the buffer layer comprises at least one selected from the group consisting of silicon nitride, silicon oxide, aluminum nitride, polysilicon, and amorphous silicon.

8. The method of manufacturing the bulk acoustic wave resonator according to claim 1, wherein the etching process has an etching selectivity ratio of the sacrificial layer to the first passivation layer and the second passivation layer, such that the first passivation layer and the second passivation layer are not removed by the etching process.

9. The method of manufacturing the bulk acoustic wave resonator according to claim 8, wherein, during the etching process, the first passivation layer and the second passivation layer respectively separate the first electrode and the second electrode apart from an etching substance used in the etching process, such that the first electrode and the second electrode are not corroded by the etching substance.

10. The method of manufacturing the bulk acoustic wave resonator according to claim 9, wherein performing the etching process to remove the sacrificial layer comprises:
    forming a release hole extending through the second passivation layer, the piezoelectric layer and the first passivation layer, wherein the release hole exposes a portion of a surface of the sacrificial layer at a side close to the first passivation layer; and
    applying the etching substance to a region where the sacrificial layer is located through the release hole, so as to remove the sacrificial layer, and form the first cavity at the location previously occupied by the sacrificial layer.

11. The method of manufacturing the bulk acoustic wave resonator according to claim 1, wherein the first conductive connector and the second conductive connector are formed on a side of the second passivation layer away from the piezoelectric layer, and the first conductive connector extends through the second passivation layer, the piezoelectric layer and the first passivation layer to be electrically connected to the first electrode, and the second conductive connector extends through the second passivation layer to be electrically connected to the second electrode.

12. The method of manufacturing the bulk acoustic wave resonator according to claim 11, further comprising:
    forming a first bonding seal ring portion on the side of the second passivation layer away from the piezoelectric layer, wherein the first bonding seal ring portion is formed on an edge of the second passivation layer, and the first conductive connector and the second conductive connector are located in a region laterally surrounded by the first bonding seal ring portion in a direction parallel to the main surface of the second substrate, and are spaced apart from the first bonding seal ring portion, wherein the first bonding seal ring portion, the first conductive connector and the second conductive connector are formed in a same manufacturing process.

13. The method of manufacturing the bulk acoustic wave resonator according to claim 12, further comprising:
    providing a third substrate structure comprising a third substrate and a bonding layer formed on the third substrate, wherein the bonding layer comprises a first bonding connection part, a second bonding connection part and a second bonding seal ring portion that are spaced apart from each other, and the first bonding connection part and the second bonding connection part are located in a region laterally surrounded by the second bonding seal ring portion in the direction parallel to the main surface of the second substrate.

14. The method of manufacturing the bulk acoustic wave resonator according to claim 13, further comprising: bonding the first bonding connection part, the second bonding connection part, and the second bonding seal ring portion of the third substrate structure to the first conductive connector, the second conductive connector, and the first bonding seal ring portion, respectively, wherein the first bonding seal ring portion and the second bonding seal ring portion constitute a seal ring structure, and the seal ring structure, the third substrate and the second passivation layer enclose to form a second cavity.

15. The method of manufacturing the bulk acoustic wave resonator according to claim 14, further comprising:
    forming a redistribution layer on a side of the third substrate away from the piezoelectric layer, wherein the redistribution layer comprises a first conductive line and a second conductive line, and the first conductive line and the second conductive line respectively extend through the third substrate to be electrically connected to the first bonding connection part and the second bonding connection part, respectively.

16. The method of manufacturing the bulk acoustic wave resonator according to claim 15, further comprising: forming a first conductive bump and a second conductive bump to be electrically connected to the first conductive line and the second conductive line, respectively, wherein the first conductive bump is electrically connected to the first electrode through the first conductive line, the first bonding connection part and the first conductive connector; and the second conductive bump is electrically connected to the second electrode through the second conductive line, the second bonding connection part and the second conductive connector.

17. The method of manufacturing the bulk acoustic wave resonator according to claim 14, wherein the second conductive connector comprises a body part and an extension part, the body part is overlapped with the second electrode in a direction perpendicular to the main surface of the second substrate, while the extension part is not overlapped with the second electrode in the direction perpendicular to the main surface of the second substrate, wherein surfaces of the body part and the extension part at a side away from the piezoelectric layer have a height difference in the direction perpendicular to the main surface of the second substrate, and the second bonding connection part laps on the extension part, wherein a thickness of the second bonding connection part in the direction perpendicular to the main surface of the second substrate is greater than the height difference.

* * * * *